(12) United States Patent
Fukui et al.

(10) Patent No.: US 8,536,242 B2
(45) Date of Patent: Sep. 17, 2013

(54) PHOTOCURABLE COMPOSITION

(75) Inventors: Hiroji Fukui, Osaka (JP); Shunsuke Kondo, Osaka (JP); Koji Arimitsu, Tokyo (JP)

(73) Assignees: Sekisui Chemical Co., Ltd., Osaka (JP); Tokyo University of Science Educational Foundation Administrative Organization, Tokyo (JP)

( * ) Notice: Subject to any disclaimer, the term of this patent is extended or adjusted under 35 U.S.C. 154(b) by 306 days.

(21) Appl. No.: 12/672,262

(22) PCT Filed: Jul. 23, 2008

(86) PCT No.: PCT/JP2008/063171
§ 371 (c)(1),
(2), (4) Date: Feb. 4, 2010

(87) PCT Pub. No.: WO2009/019979
PCT Pub. Date: Feb. 12, 2009

(65) Prior Publication Data
US 2011/0097669 A1    Apr. 28, 2011

(30) Foreign Application Priority Data
Aug. 9, 2007  (JP) ................................. 2007-207540

(51) Int. Cl.
C08F 2/50 (2006.01)
C08G 18/67 (2006.01)
G03C 1/00 (2006.01)
G03F 7/00 (2006.01)

(52) U.S. Cl.
USPC ............. 522/46; 522/121; 522/164; 522/174; 430/270.1; 430/281.1

(58) Field of Classification Search
USPC ................ 522/46, 121, 164, 174; 430/281.1, 430/270.1
See application file for complete search history.

(56) References Cited

U.S. PATENT DOCUMENTS
| | | | | |
|---|---|---|---|---|
| 2003/0157338 A1* | 8/2003 | Kondo et al. | ............ | 428/423.3 |
| 2004/0048978 A1* | 3/2004 | Okada et al. | .................. | 524/606 |
| 2008/0070998 A1* | 3/2008 | Takada et al. | ................ | 521/50.5 |
| 2009/0030108 A1* | 1/2009 | Ito et al. | ........................ | 523/106 |
| 2012/0086762 A1* | 4/2012 | Noguchi et al. | ............. | 347/102 |

FOREIGN PATENT DOCUMENTS
| | | |
|---|---|---|
| EP | 2 093 269 A1 | 8/2009 |
| JP | 10-152548 A | 6/1998 |
| JP | 10-251615 A | 9/1998 |
| JP | 2002-138076 A | 5/2002 |
| JP | 2002-265531 A | 9/2002 |
| JP | 2006-282657 A | 10/2006 |
| JP | 2007-56233 A | 3/2007 |
| JP | 2007-77382 A | 3/2007 |
| JP | 2007-101685 A | 4/2007 |
| JP | 2008-1857 A | 1/2008 |
| WO | WO 2006/035916 * | 4/2006 |
| WO | WO 2006/1152255 * | 11/2006 |
| WO | WO-2008/072651 A1 | 6/2008 |

OTHER PUBLICATIONS

Narita et al., Machine English translation of JP 2003-344993, pub Dec. 2003.*
International Search Report for the Application No. PCT/JP2008/063171 mailed Oct. 28, 2008.
Arimitsu, Koji et al., "Preparation of Novel Photobase Generators Based on Photodecarboxylation and Their Application of Photoreactive Materials", Polymer Preprints, Japan, 2005, vol. 54, No. 1, p. 1357.
International Preliminary Report on Patentability for Application No. PCT/JP2008/063171 mailed Mar. 4, 2010.
Notification of Reasons for Refusal for the Application No. 2008-534605 from Japan Patent Office mailed Jul. 30, 2013.

* cited by examiner

*Primary Examiner* — Mark Eashoo
*Assistant Examiner* — Jessica Roswell
(74) *Attorney, Agent, or Firm* — Cheng Law Group, PLLC

(57) ABSTRACT

The present invention provides a photocurable composition which contains a photobase generator capable of generating a satisfactory amount of a base in a high quantum yield when irradiated even with a small quantity of light for a short time, and contains a curable compound that is rapidly cured by the generated base such that the composition is cured into a cured product. The photocurable composition comprises: a photobase generator (A) which is a salt of a carboxylic acid (a1-1) represented by the following formula (1-1) with a basic compound (a2), and a curable compound (B) which has, in one molecule thereof, at least two functional groups selected from among epoxy group, (meth)acryloyl group, isocyanato group, acid anhydride group, and alkoxysilyl group,

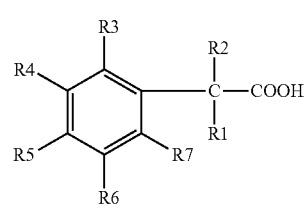

(1-1)

where R1 to R7 in the above formula (1-1) each are hydrogen or an organic group, R1 to R7 may be the same or different, and two of R1 to R7 may be bonded to each other to form a ring structure.

12 Claims, No Drawings

PHOTOCURABLE COMPOSITION

CROSS REFERENCES TO PRIOR APPLICATIONS

This application is a US National Phase Application under 35 U.S.C. §371 of International Patent Application No. PCT/JP2008/063171, filed on 23 Jul. 2008, and claims benefit to Japanese Patent Application No. 2007-207540, filed on 9 Aug. 2007.

TECHNICAL FIELD

The present invention relates to a photocurable composition that contains a photobase generator and a curable compound. More specifically, the present invention relates to a photocurable composition which contains a photobase generator generating a base upon irradiation with light, and contains a curable compound that is cured by the base such that the composition is cured into a cured product.

BACKGROUND ART

Photocurable compositions are known which contain a compound generating a base upon irradiation with light and a curable compound that is cured by the base generated from the above compound. Such photocurable compositions are used for products such as adhesives, pressure-sensitive adhesives, paints, coating agents, resists, and sealing agents.

Compounds known for generating a base upon irradiation with light include cobalt-amine complexes, o-nitrobenzyl carbamate, and oxime ester compounds. These compounds generate an amine when irradiated with light. However, the quantum yield of the generated amine upon irradiation with light is low. Accordingly, studies have been done on increasing the amine quantum yield.

For example, the following Patent Document 1 discloses a compound capable of increasing the amine quantum yield, that is, a compound having a carbamoyloxyimino group represented by the following formula (X), which generates an amine when irradiated with light.

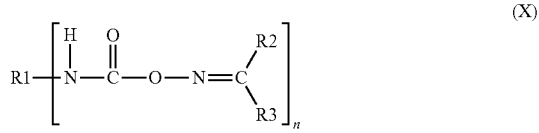
(X)

R1 in the above formula (X) is an n-valent organic group. R2 and R3 each are hydrogen, an aromatic group, or an aliphatic group. "n" is an integer of 1 or greater.

Further, the following Patent Document 2 discloses a photosensitive composition that contains a polymer precursor and a salt of a carboxylic acid and an amine, the salt is decarboxylated when irradiated with light. Patent Document 2 describes a salt of a ketoprofen and an amine as a compound that generates an amine when irradiated with light. Further, a polyimide precursor, a polybenzoxazole precursor or the like is used as the polymer precursor.

The following Non-Patent Document 1 discloses a photocurable material containing a base-reactive resin and a salt of a ketoprofen and an amine, the salt described in Patent Document 2. A liquid epoxy resin is used as the base-reactive resin.

Patent Document 1: JP 2002-138076 A
Patent Document 2: JP 2007-101685 A
Non-Patent Document 1: Arimitsu et al. "Polymer Preprints, Japan" issued on May 25, 2005, p. 1357

DISCLOSURE OF THE INVENTION

The compound generating an amine when irradiated with light according to Patent Document 1 has excellent photodegradability and generates an amine in a high quantum yield when irradiated with light. Although the amine quantum yield is comparatively high here, an even higher quantum yield is desired.

Further, a curable compound, which is to be used with a compound generating a base upon irradiation with light, needs to be rapidly cured by the base that is generated upon the irradiation with light.

Patent Document 2 describes the polymer precursor as the curable compound. The polymer precursor itself is a polymer, and causes intramolecular ring-closing reaction. This reaction cures the photosensitive composition containing the polymer precursor, and a cured product produced thereby exhibits desired physical properties. Such polymer precursor is not designed to increase the molecular weight of a reaction product that is produced through a reaction of the polymer precursor. It is difficult to exhibit the desired physical properties by increasing the molecular weight through the reaction of the polymer precursor.

A polymer precursor with a relatively small molecular weight can be used as the polymer precursor in order to adjust, without a solvent, the viscosity of the composition to a level that allows easy coating. However, this makes the molecular weight of the reaction product even smaller. In this case, sometimes, the cohesion force of the cured product after exposure is low, and the adhesion and the cohesion are not exhibited sufficiently.

The photocurable material according to Non-Patent Document 1 can increase the hardness of the cured product after exposure, but may not achieve sufficient adhesion.

The present invention mainly aims to provide a photocurable composition which contains a photobase generator capable of generating a satisfactory amount of a base in a high quantum yield when irradiated even with a small quantity of light for a short time, and contains a curable compound that is rapidly cured by the generated base such that the composition is cured into a cured product. The present invention particularly aims to provide a photocurable composition which is capable of generating a satisfactory amount of a base when irradiated even with a small quantity of light for a short time, and contains a curable compound that is rapidly cured by the generated base such that the composition exhibits high adhesion.

The present invention provides a photocurable composition comprising: a photobase generator (A) which is a salt of a carboxylic acid (a1-1) represented by the following formula (1-1) with a basic compound (a2), and a curable compound (B) which has, in one molecule thereof, at least two functional groups selected from among epoxy group, (meth)acryloyl group, isocyanato group, acid anhydride group, and alkoxysilyl group.

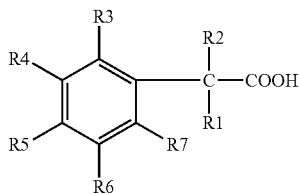
(1-1)

R1 to R7 in the above formula (1-1) each are hydrogen or an organic group, R1 to R7 may be the same or different, and two of R1 to R7 may be bonded to each other to form a ring structure.

In a particular aspect of the present invention, one of R3 to R7 in the above formula (1-1) is an organic group represented by the following formula (1-2).

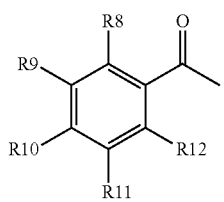
(1-2)

R8 to R12 in the above formula (1-2) each are hydrogen or an organic group, R8 to R12 may be the same or different, and two of R8 to R12 may be bonded to each other to form a ring structure.

In yet another particular aspect of the present invention, R1 in the above formula (1-1) is a methyl group.

In yet another particular aspect of the present invention, the carboxylic acid (a1-1) represented by the above formula (1-1) is a carboxylic acid (a1) represented by the following formula (1).

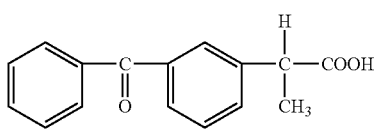
(1)

In yet another particular aspect of the present invention, the curable compound (B) is a curable compound having at least two epoxy groups in one molecule, and is at least one resin selected from among glycidyl ether epoxy resin, glycidyl ester epoxy resin, and glycidyl amine epoxy resin.

In yet another particular aspect of the present invention, the curable compound (B) is an urethane prepolymer having isocyanato groups.

The basic compound (a2) is preferably an amine. If the basic compound (a2) is an amine, the curable compound (B) may be cured more rapidly.

Further, the amine preferably has at least two amino groups in one molecule. This may allow the curable compound (B) to be cured even more rapidly.

In the present invention, the amine is preferably an amine represented by any one of the following formulae (2) to (7). In this case, the curable compound (B) may be cured even more rapidly.

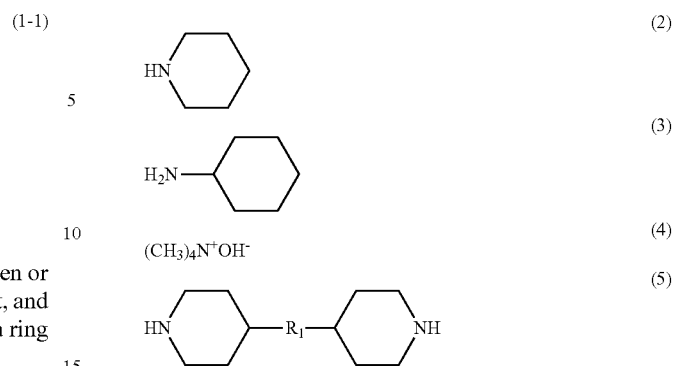

$R_1$ in the above formula (5) is a $C_1$-$C_{10}$ alkylene group.

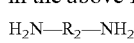
(6)

$R_2$ in the above formula (6) is a $C_1$-$C_{10}$ alkylene group.

(7)

The photocurable composition according to the present invention preferably further comprises a base proliferating agent (C). If the photocurable composition comprises a base proliferating agent (C), the curable compound (B) may be cured even more rapidly.

Further, the photocurable composition according to the present invention preferably further comprises a photo-sensitizer (D). If the photocurable composition comprises a photo-sensitizer (D), the curable compound (B) may be cured even more rapidly.

In yet another particular aspect of the present invention, a molar ratio of the functional group selected from among epoxy group, (meth)acryloyl group, isocyanato group, acid anhydride group, and alkoxysilyl group to a basic functional group of the basic compound (a2) is within the range of 1:0.01 to 1:2.

In yet another particular aspect of the present invention, a value (number-average molecular weight/the number of functional groups) calculated by dividing a number-average molecular weight of the curable compound (B) by the number of the functional groups selected from among epoxy group, (meth)acryloyl group, isocyanato group, acid anhydride group, and alkoxysilyl group is within the range of 170 to 50000.

The photocurable composition according to the present invention is used for various products. Particularly, the photocurable composition according to the present invention is suitably used as an adhesive. The photocurable composition according to the present invention is preferably a photocurable adhesive composition. Further, the photocurable composition according to the present invention is suitably used also as a coating agent. The photocurable composition according to the present invention is also preferably a photocurable coating composition.

Effect of the Invention

The photocurable composition according to the present invention comprises a photobase generator (A) which is a salt of a carboxylic acid (a1-1) represented by the above formula (1-1) with a basic compound (a2). Therefore, the photocurable composition (A) can generate a satisfactory amount of a base in a high quantum yield when irradiated even with a small quantity of light for a short time.

Further, a curable compound (B) used in combination with the photobase generator (A) has, in one molecule thereof, at least two functional groups selected from among epoxy group, (meth)acryloyl group, isocyanato group, acid anhydride group, and alkoxysilyl group. Therefore, the curable compound (B) is cured by the generated base even more rapidly such that the composition is cured into a cured product.

If the curable compound (B) used in combination with the photobase generator (A) is a curable compound having at least two epoxy groups in one molecule, and is at least one resin selected from among glycidyl ether epoxy resin, glycidyl ester epoxy resin, and glycidyl amine epoxy resin, the curable compound (B) is cured by the generated base even more rapidly.

BEST MODE FOR CARRYING OUT THE INVENTION

Hereinafter, the present invention will be described in detail.

In order to solve the above problems, the inventors of the present invention intensively studied photocurable compositions comprising a photobase generator that generates a base when irradiated with light and a curable compound. As a result, the inventors have reached a composition that comprises a photobase generator (A), which is a salt of a carboxylic acid (a1-1) represented by the above formula (1-1) with a basic compound (a2), and the above curable compound (B). This formulation enables the composition to generate a satisfactory amount of a base in a high quantum yield when irradiated even with a small quantity of light for a short time, and allows the curable compound (B) to be rapidly cured by the generated base. Thereby, the inventors completed the present invention.

(Photobase Generator (A))

The photobase generator (A) comprised in the photocurable composition according to the present invention is a salt of a carboxylic acid (a1-1) represented by the following formula (1-1) with a basic compound (a2).

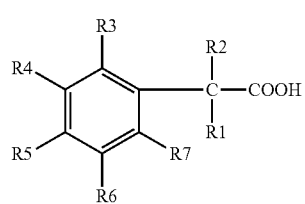

(1-1)

R1 to R7 in the above formula (1-1) each are hydrogen or an organic group. R1 to R7 may be the same or different. Two of R1 to R7 may be bonded to each other to form a ring structure.

Further, one of R3 to R7 in the above formula (1-1) is preferably an organic group represented by the following formula (1-2).

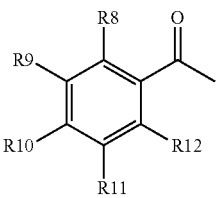

(1-2)

R8 to R12 in the above formula (1-2) each are hydrogen or an organic group. R8 to R12 may be the same or different. Two of R8 to R12 may be bonded to each other to form a ring structure.

Further, R1 in the above formula (1-1) is preferably a methyl group.

Specific examples of the carboxylic acid (a1-1) represented by the above formula (1-1) include phenylacetic acid, diphenylacetic acid, triphenylacetic acid, 2-phenylpropionic acid, 2,2-diphenylpropionic acid, 2,2,2-triphenylpropionic acid, 2-phenylbutyric acid, α-methoxyphenylacetic acid, mandelic acid, atrolactic acid, benzylic acid, tropic acid, phenylmalonic acid, phenylsuccinic acid, 3-methyl-2-phenylbutyric acid, o-tolyl acetic acid, m-tolyl acetic acid, 4-isobutyl-α-methylphenylacetic acid, p-tolyl acetic acid, 1,2-phenylene diacetic acid, 1,3-phenylene diacetic acid, 1,4-phenylene diacetic acid, 2-methoxyphenylacetic acid, 2-hydroxyphenylacetic acid, 2-nitrophenylacetic acid, 3-nitrophenylacetic acid, 4-nitrophenylacetic acid, 2-(4-nitrophenyl)propionic acid, 3-(4-nitrophenyl)propionic acid, 4-(4-nitrophenyl)propionic acid, 3,4-dimethoxyphenylacetic acid, 3,4-(methylenedioxy)phenylacetic acid, 2,5-dimethoxyphenylacetic acid, 3,5-dimethoxyphenylacetic acid, 3,4,5-trimethoxyphenylacetic acid, 2,4-dinitrophenylacetic acid, 4-biphenylacetic acid, 1-naphthylacetic acid, 2-naphthylacetic acid, 6-methoxy-α-methyl-2-naphthylacetic acid, 1-pyreneacetic acid, 9-fluorene carboxylic acid, and 9H-xanthene-9-carboxylic acid.

Simply mixing the carboxylic acid (a1-1) represented by the above formula (1-1) and the basic compound (a2) in a vessel makes it possible to easily prepare the above photobase generator (A) without taking a complex synthetic route. Mixing the carboxylic acid (a1-1) represented by the above formula (1-1) and the basic compound (a2) in a vessel allows an acid-base reaction represented by the following scheme (8-1) to proceed to generate a salt.

scheme (8-1)

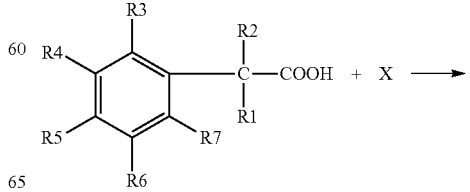

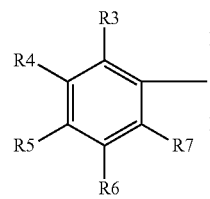

X in the above scheme (8-1) is the basic compound (a2).

The photobase generator (A) has a framework derived from the carboxylic acid (a1-1) represented by the above formula (1-1), and is easily decarboxylated when irradiated with light, which allows a reaction represented by the following scheme (9-1) to proceed. Therefore, the photobase generator (A) has excellent photodegradability solely even without a photosensitizer. That is, the photobase generator (A) can generate a satisfactory amount of a base in a very high quantum yield when irradiated even with a small quantity of light for a short time.

scheme (9-1)

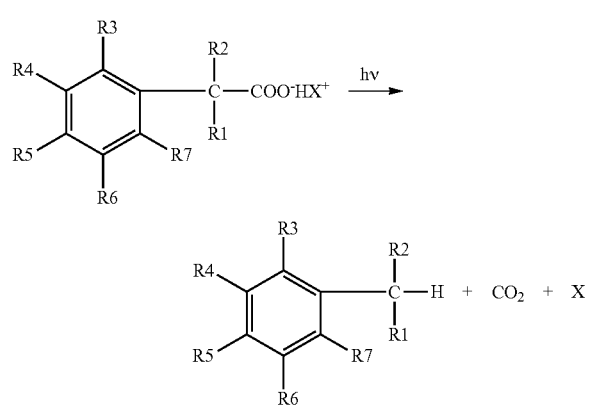

X in the above scheme (9-1) is the basic compound (a2).

R1 to R7 in the above schemes (8-1) and (9-1) each are hydrogen or an organic group. R1 to R7 may be the same or different. Two of R1 to R7 may be bonded to each other to form a ring structure.

In particular, the carboxylic acid (a1-1) represented by the above formula (1-1) is preferably a carboxylic acid (a1) represented by the following formula (1). The carboxylic acid (a1) represented by the following formula (1) has particularly excellent photodegradability.

(1)

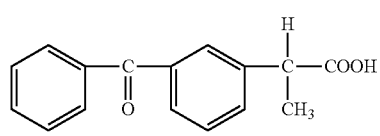

Mixing the carboxylic acid (a1) represented by the above formula (1) and the basic compound (a2) in a vessel causes an acid-base reaction represented by the following scheme (8) to proceed to generate a salt.

scheme (8)

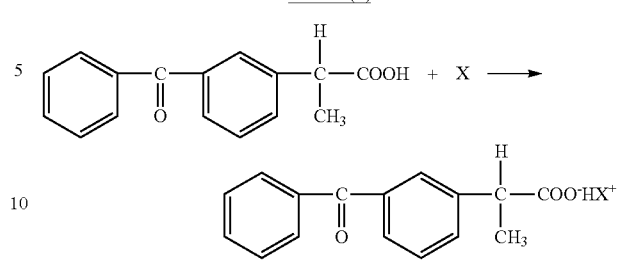

X in the above scheme (8) is the basic compound (a2).

Further, a salt produced through the acid-base reaction represented by the above scheme (8) is easily decarboxylated when irradiated with light, which allows a reaction represented by the following scheme (9) to proceed.

scheme (9)

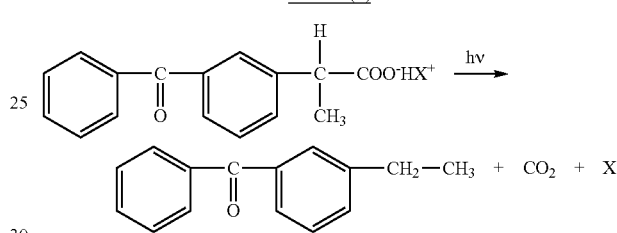

Any of carboxylic acids (a1-3) to (a1-6) represented by the following respective formulae (1-3) to (1-6) can be suitably used as the carboxylic acid (a1-1) represented by the above formula (1-1).

(1-3)

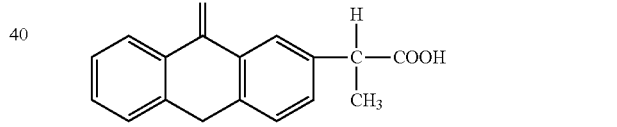

(1-4)

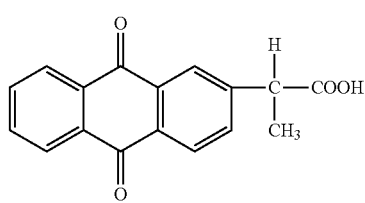

(1-5)

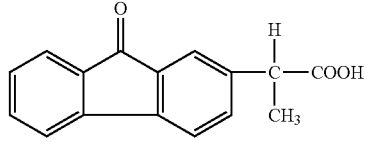

(1-6)

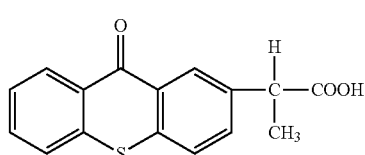

The above basic compound (a2) is not particularly limited. Examples of the above basic compound (a2) include amine, compound having a pyridyl group, hydrazine compound, amide compound, quaternary ammonium hydroxide, mercapto compound, sulfide compound, and phosphine compound.

The above amine is not particularly limited. The amine can be any of primary amine, secondary amine, and tertiary amine.

Examples of the primary amine include methylamine, ethylamine, n-propylamine, n-butylamine, amylamine, n-hexylamine, n-heptylamine, n-octylamine, n-nonylamine, n-decylamine, n-undecylamine, n-dodecylamine, n-tridecylamine, n-tetradecylamine, n-pentadecylamine, n-hexadecylamine, n-octadecylamine, isopropylamine, isobutylamine, sec-butylamine, tert-butylamine, 1-methylbutylamine, 1-ethylpropylamine, isoamylamine, 1,2-dimethylpropylamine, tert-amylamine, 1,3-dimethylbutylamine, 3,3-dimethylbutylamine, 2-aminoheptane, 3-aminoheptane, 1-methylheptylamine, 2-ethylhexylamine, 1,5-dimethylhexylamine, tert-octylamine, ethylenediamine, 1,3-diaminopropane, 1,2-diaminopropane, 1,4-diaminobutane, 1,2-diamino-2-methylpropane, 1,5-diaminopentane, 1,3-diaminopentane, 1,5-diamino-2-methylpentane, 1,7-diaminoheptane, 1,8-diaminooctane, 1,9-diaminononane, 1,10-diaminodecane, 1,12-diaminododecane, 2-butyl-2-ethyl-1,5-pentanediamine, cyclopropylamine, (aminomethyl)cyclopropane, cyclobutylamine, cyclopentylamine, 5-amino-2,2,4-trimethyl-1-cyclopentanemethylamine, cyclohexylamine, 2-methylhexylamine, 4-methylcyclohexylamine, 4,4'-methylenebis(cyclohexylamine), 2,3-dimethylcyclohexylamine, 4,4'-methylenebis(2-methylcyclohexylamine), 1,2-diaminocyclohexane, cyclohexanemethylamine, 1,8-diamino-p-menthane, 5-amino-1,3,3-trimethylcyclohexanemethylamine, cycloheptylamine, cyclooctylamine, cyclododecylamine, 2-aminonorbornene, bornylamine, myrtanylamine, 1-adamantaneamine, 1-adamantanemethylamine, allylamine, oleylamine, geranylamine, 2,2,2-trifluoromethylamine, 2-methoxyethylamine, 3-methoxypropylamine, 3-ethoxypropylamine, 3-butoxypropylamine, 2-amino-1-methoxypropane, 3-isopropoxypropylamine, 2,2'-oxybis(ethyleneamine), 2,2'-(ethylenedioxy)bis(ethylamine), 4,9-dioxa-1,12-dodecanediamine, 4,7,10-trioxa-1,13-tridecanediamine, 3-amino-1-propanol vinyl ether, tetrahydrofurylamine, 2,5-dihydro-2,5-dimethoxyfurfurylamine, aminoacetaldehyde dimethyl acetal, 4-aminobutylaldehyde diethyl acetal, ethanolamine, 3-amino-1-propanol, 2-amino-1-propanol, 1-amino-2-propanol, 4-amino-1-butanol, 2-amino-1-butanol, 2-amino-2-methyl-1-propanol, 5-amino-1-pentanol, 2-amino-1-pentanol, 2-amino-3-methyl-1-butanol, 6-amino-1-hexanol, 2-amino-1-hexanol, 1-amino-1-cyclopentanemethanol, 2-aminocyclohexanol, 4-aminocyclohexanol, 1-aminomethyl-1-cyclohexanol, 3-aminomethyl-3,5,5-trimethylcyclohexane, 2-(2-aminoethoxy)ethanol, 2-(methylamino)ethanol, 2-(ethylamino)ethanol, 2-(propylamino)ethanol, 2-(tert-butylamino)ethanol, 3-amino-1,2-propanediol, SERINOL, 2-amino-2-ethyl-1,3-propanediol, 2-amino-2-methyl-1,3-propanediol, tris(hydroxymethyl)aminomethane, BIS-HOMOTORIS, 1,3-diamino-2-hydroxypropane, 1-amino-deoxysorbitol, 2-aminomethyl-15-crown-5,2-aminomethyl-18-crown-6, aniline, o-toluidine, m-toluidine, p-toluidine, 2-ethyl aniline, 3-ethyl aniline, 4-ethyl aniline, 2-propyl aniline, 3-propyl aniline, 4-propyl aniline, 2-isopropyl aniline, 3-isopropyl aniline, 4-isopropyl aniline, 2-butyl aniline, 3-butyl aniline, 4-butyl aniline, 2-sec-butyl aniline, 3-sec-butyl aniline, 4-sec-butyl aniline, 2-tert-butyl aniline, 3-tert-butyl aniline, 4-tert-butyl aniline, 4-pentyl aniline, 4-hexyl aniline, 4-heptyl aniline, 4-octyl aniline, 4-decyl aniline, 4-dodecyl aniline, 4-tetradecyl aniline, 4-hexadecyl aniline, 4-cyclohexyl aniline, 2,2'-ethylenedianiline, o-anisidine, m-anisidine, p-anisidine, o-phenetidine, m-phenetidine, p-phenetidine, 2-aminophenol, 3-aminophenol, 4-aminophenol, 2-aminothiophenol, 3-aminothiophenol, 4-aminothiophenol, 2-aminobenzyl alcohol, 2-aminophenyl ethyl alcohol, 3-aminophenyl ethyl alcohol, 4-aminophenyl ethyl alcohol, 3-(1-hydroxyethyl)aniline, 2-(methylmercapto)aniline, 3-(methylmercapto)aniline, 4-(methylmercapto)aniline, 2-aminophenyl disulfide, 2-isopropenylaniline, 4,4'-ethylenedianiline, 3,3'-methylenedianiline, 4,4'-methylenedianiline, 4,4'-methylenebis(3-chloro-2,6-diethylaniline), 4,4'-diaminostilbene, 4-butoxyaniline, 4-pentyloxyaniline, 4-hexyloxyaniline, 4,4'-oxydianiline, 4,4'-thiodianiline, 4'',4''''-(hexafluoroisopropylidene)-bis-(4-phenylaniline), oxydianiline, 4-aminophenyl sulfide, 2,3-dimethylaniline, 2,4-dimethylaniline, 2,5-dimethylaniline, 2,6-dimethylaniline, 3,4-dimethylaniline, 3,5-dimethylaniline, 6-ethyl-o-toluidine, 2,6-diethylaniline, 2-isopropyl-6-methylaniline, 2,6-diisopropylaniline, 1-amino-5,6,7,8-tetrahydronaphthalene, 5-aminoindane, 2-fluoroaniline, 3-fluoroaniline, 4-fluoroaniline, 2-chloroaniline, 3-chloroaniline, 4-chloroaniline, 2-bromoaniline, 3-bromoaniline, 4-bromoaniline, 2-iodoaniline, 3-iodoaniline, 4-iodoaniline, 2-(trifluoromethyl)aniline, 3-(trifluoromethyl)aniline, 4-(trifluoromethyl)aniline, 3-(trifluoromethoxy)aniline, 4-(trifluoromethoxy)aniline, 3-(1,1,2,2-tetrafluoroethyl)aniline, 4-fluoro-2-methylaniline, 3-chloro-2-methylaniline, 2-chloro-6-methylaniline, 2,6-difluoroaniline, 2,3-difluoroaniline, 2,6-dichloroaniline, 2,3-dichloroaniline, 2,6-dibromoaniline, 2-methoxy-6-methylaniline, 3-fluoro-o-anisidine, 3-amino-2-methylbenzyl alcohol, 2-amino-3-methylbenzyl alcohol, 2-amino-m-cresol, 2,3-diaminophenol, o-toluidine, 4,4'-ethylenedi-m-toluidine, 2,5-di-tert-butylaniline, 3-fluoro-4-methylaniline, 2-fluoro-4-methylaniline, 5-fluoro-2-methylaniline, 2-fluoro-5-methylaniline, 4-fluoro-2-methylaniline, 2-fluoro-6-methylaniline, 2,5-bis(trifluoromethyl)aniline, 2-fluoro-6-(trifluoromethyl)aniline, 2-fluoro-3-(trifluoromethyl)aniline, 2,4-difluoroaniline, 3,4-difluoroaniline, 2,5-difluoroaniline, 3-chloro-4-fluoroaniline, 2-chloro-4-fluoroaniline, 2-bromo-4-fluoroaniline, 4-bromo-2-fluoroaniline, 2-bromo-4-iodoaniline, 2-chloro-4-aminotoluene, 2-chloro-4-methylaniline, 2-chloro-5-methylaniline, 5-chloro-2-methylaniline, 4-chloro-2-methylaniline, 3,4-dichloroaniline, 2,4-dichloroaniline, 2,5-dichloroaniline, 4-bromo-2-methylaniline, 4-bromo-3-methylaniline, 3-bromo-4-methylaniline, 2-bromo-4-methylaniline, 4-bromo-2-chloroaniline, 2,4-dibromoaniline, 2,5-dibromoaniline, 4-fluoro-2-(trifluoromethyl)aniline, 4-fluoro-3-(trifluoromethyl)aniline, 2-fluoro-5-(trifluoromethyl)aniline, 4-chloro-3-(trifluoromethyl)aniline, 4-chloro-2-(trifluoromethyl)aniline, 4-bromo-2-(trifluoromethyl)aniline, 4-bromo-3-(trifluoromethyl)aniline, 2-bromo-5-(trifluoromethyl)aniline, 2-chloro-5-(trifluoromethyl)aniline, 5,5'-(hexafluoroisopropylidene)di-o-toluidine, 4-methoxy-2-methylaniline, 2-methoxy-5-methylaniline, 5-methoxy-2-methylaniline, 5-tert-butyl-o-anisidine, 2-methoxy-5-(trifluoromethyl)aniline, 6-chloro-m-anisidine, 4-amino veratrol, 3,4-(methylenedioxy)aniline, 1,4-benzodioxane-6-amine, 4'-aminobenzo-15-crown-5,2,4-dimethoxyaniline, 4-aminocresol, 2,5-dimethoxyaniline, 5-amino-2-methoxyphenol, 3-amino-o-cresol, 2-amino-o-cresol, 2-amino-tert-butylphenol, 2-amino-tert-amylphenol, 6-amino-m-cresol, 4-amino-m-cresol, 2-amino-5-methylbenzyl alcohol, 3-amino-4-methylbenzyl alcohol, 2-amino-4-chlorophenol, 4-amino-3-chlorophenol, 2-amino-5-chlorobenzyl alcohol, 5-chloro-o-anisidine, 3-fluoro-p-anisidine, 3-chloro-p-anisidine, 2-amino-4-(trifluoromethyl)benzenethiol, 3,5-dimethylaniline, 3,5-di-tert-butylaniline, 3,5-bis(trifluoromethyl)aniline, 3,5-difluoroaniline, 3,5-dichloroaniline, 3,5-dimethoxyaniline, 3-methoxy-5-(trifluoromethyl)aniline, 2,4,6-trimethylaniline, 4,4'-methylenebis(2,6-dimethylaniline), 4,4'-methylenebis(2,6-diethylaniline), 4,4'-methylenebis(2,6-diisopropylaniline), 2,4,6-tri-tert-butylaniline, 2-chloro-4,6-dimethylaniline, 2,6-dichloro-3-methylaniline, 3-chloro-2,4-difluoroaniline, 2,3,4-trichloroaniline, 2,3,4-trifluoroaniline, 2,3,6-trifluoroaniline, 2,4,6-trifluoroaniline, 2,6-dibromo-4-methylaniline, 3-chloro-2,6-diethylaniline, 4-bromo-2,6-dimethylaniline, 2-chloro-3,5-difluoroaniline, 4-bromo-2,6-difluoroaniline, 2-bromo-4-chloro-6-fluoroaniline, 2,4-dibromo-6-fluoroaniline, 2,6-dibromo-4-fluoroaniline, 2,6-dichloro-4-(trifluoromethyl)aniline, 4-chloro-2,6-dibromoaniline, 4-amino-2,6-dichlorophenol, 3,4,5-trichloroaniline, 3,4,5-trimethoxyaniline, 3,3',5,5'-tetramethylbenzidine, 2-bromo-4,6-difluoroaniline, 2,4,6-trichloroaniline, 2,6-dichloro-4-(trifluoromethoxy)aniline, 2-bromo-3,5-bis(trifluoromethyl)aniline, 2,4,6-tribromoaniline, 2-chloro-4-fluoro-5-methylaniline, 2,4,5-trifluoroaniline, 2,4,5-trichloroaniline, 4-chloro-2-methoxy-5-methylaniline, 4-amino-2,5-dimethylphenol, 4-amino-2,6-dibromophenol, 3,5-dichloro-2,6-diethylaniline, 2,3,5,6-tetrachloroaniline, 2,3,5,6-tetrafluoroaniline, 2,3,4,5-tetrafluoroaniline, 2,3,4,6-tetrafluoroaniline, 2-bromo-3,4,6-trifluoroaniline, 2-bromo-4,5,6-trifluoroaniline, 2-amino-2,4-dichloro-3-methylphenol, 2,3,5,6-tetrafluoro-4-trifluoromethylaniline, 2,3,4,5,6-pentafluoroaniline, 4,4'-diaminooctafluorobiphenyl, 4-methoxy-3-biphenylamine, 4-bromo-2,3,5,6-tetrafluoroaniline, 1,2-phenylenediamine, 2,3-diaminotoluene, 3,4-diaminotoluene, 3,3'-diaminobenzidine, 4-chloro-1,2-phenylenediamine, 4-methoxy-1,2-phenylenediamine, 4,5-dimethyl-1,2-phenylenediamine, 1,2,4,5-benzenetetramine, 4,5-dichloro-1,2-phenylenediamine, 1,3-phenylenediamine, 2,6-diaminotoluene, 2,4-diaminotoluene, 2,4,6-trimethyl-1,3-phenylenediamine, 4-methoxy-1,3-phenylenediamine, 2,4-diaminophenol, 4-(2-hydroxyethylthio)-1,3-phenylenediamine, 1,4-phenylenediamine, 2,5-diaminotoluene, 2,5-dimethyl-1,4-phenylenediamine, 2-chloro-1,4-phenylenediamine, 2,5-dichloro-1,4-phenylenediamine, 2-methoxy-1,4-phenylenediamine, 2,3,5,6-tetramethyl-1,4-phenylenediamine, 2-aminobiphenyl, 4-aminobiphenyl, 2,4,6-triphenylaniline, 2-amino-4-phenylphenol, 5-phenyl-o-anisidine, benzylamine, α-methylbenzylamine, aminodiphenylmethane, tritylamine, 1,2-diphenylethylamine, 2,2-diphenylethyleneamine, 2-amino-1,2-diphenylethanol, phenethylamine, 2-amino-3-phenyl-1-propanol, 2-phenylcyclopropylamine, 3-phenyl-1-propylamine, 3,3-diphenylpropylamine, 1-methyl-3-phenylpropylamine, 4-phenylbutylamine, 1,2-diphenylethylenediamine, 1,2-bis(4-methoxyphenyl)ethylenediamine, 4-(2,4-di-tert-amylphenoxy)butylamine, 2-amino-1-phenylethanol, 2-phenylglycinol, 2-amino-3-phenyl-1-propanol, NOREPHEDRINE, 2-methylbenzylamine, 1-aminoindan, 2-aminoindan, 1,2,3,4-tetrahydro-1-naphthylamine, 2-(trifluoromethyl)benzylamine, 2-fluorobenzylamine, 2-fluorophenethylamine, 2-chlorobenzylamine, 2-chlorophenethylamine, 2-bromobenzylamine, 2-methoxybenzylamine, 2-methoxyphenethylamine, 2-ethoxybenzylamine, 2-[2-(aminomethyl)phenylthio]benzyl alcohol, 2-aminobenzylamine, 3-methylbenzylamine, 3-(trifluoromethyl)benzylamine, m-xylenediamine, 3-fluorobenzylamine, 3-fluorophenethylamine, 3-chlorobenzylamine, 3-chlorophenethylamine, 3-bromobenzylamine, 3-iodobenzylamine, 3-methoxyphenethylamine, 4-methylbenzylamine, p-xylenediamine, 4-(trifluoromethyl)benzylamine, α,4-dimethylbenzylamine, 2-(p-tolyl)ethylamine, 4-fluorobenzylamine, 4-fluorophenethylamine, 4-chlorobenzylamine, 4-bromobenzylamine, 4-bromophenethylamine, 4-fluoro-α-methylbenzylamine, 4-fluorophenethylamine, 4-chlorophenethylamine, 4-methoxybenzylamine, 4-methoxyphenethylamine, 4-(trifluoromethoxy)benzylamine, 4-aminobenzylamine, 2-(4-aminophenyl)ethylamine, TYRAMINE, 3,5-bis(trifluoromethyl)benzylamine, 3-fluoro-5-(trifluoromethyl)benzylamine, 2,6-difluorobenzylamine, 2,4-difluorobenzylamine, 2,5-difluorobenzylamine, 3,4-difluorobenzylamine, 2,4-dichlorobenzylamine, 3,4-dichlorobenzylamine, 2,4-dichlorophenethylamine, 2,3-dimethoxybenzylamine, 3,5-dimethoxybenzylamine, 2,4-dimethoxybenzylamine, 3,4-dimethoxybenzylamine, 2,5-dimethoxyphenethylamine, 3,4-dimethoxyphenethylamine, piperonylamine, 3,4,5-trimethoxybenzylamine, 2,4,6-trimethoxybenzylamine, 1-amino-indanol, 1-naphthalenemethylamine, 1-(1-naphthyl)ethylamine, 9-aminofluorene, 1-pyrenemethylamine, α,ω-diaminopolyethylene glycol, α,ω-diaminopolypropylene glycol, α,ω-diaminopolydimethylsiloxane, and polyallylamine.

Examples of the secondary amines include dimethylamine, N-ethylmethylamine, diethylamine, N-methylpropylamine, N-methylisopropylamine, N-ethylisopropylamine, dipropylamine, diisopropylamine, N-methylbutylamine, N-ethylbutylamine, N-methyl-tert-butylamine, N-tert-butylisopropylamine, dibutylamine, di-sec-butylamine, diisobutylamine, tert-amyl-tert-butylamine, dipentylamine, N-methylhexylamine, dihexylamine, tert-amyl-tert-octylamine, dioctylamine, bis(2-ethylhexyl)amine, didecylamine, N-methyloctadecylamine, N,N'-dimethylethylenediamine, N,N'-diethylethylenediamine, N,N'-diisopropylethylenediamine, N,N'-dimethyl-1,3-propanediamine, N,N'-diethyl-1,3-propanediamine, N,N'-diisopropyl-1,3-propanediamine, N,N'-dimethyl-1,6-hexanediamine, N-propylcyclopropanemethylamine, N-methylcyclohexylamine, N-ethylcyclohexylamine, N-isopropylcyclohexylamine, N-tert-butylcyclohexylamine, dicyclohexylamine, N,N'-bis(3,3-dimethylbutyl)-1,2-cyclohexanediamine, 1-cyclohexylethylamine, 1,3-cyclohexanebis(methylamine), N-methylallylamine, N-methyl-2-methylallylamine, diallylamine, N,N'-diethyl-2-butylene-1,4-diamine, N-allylcyclopentylamine, N-allylcycloamine, 2-(1-cyclohexene)ethylamine, 6-(dimethylamino)fulvene, bis(2-methoxyethyl)amine, methylaminoacetaldehyde dimethylacetal, diethylaminoacetaldehyde diethylacetal, 2-methylaminoethyl-1,3-dioxolane, diethanolamine, diisopropanolamine, N,N'-bis(2-hydroxyethyl)ethylenediamine, 1,3-bis[tris(hydroxymethyl)methylamino]propane, N-methylglucamine, 2-methylaziridine, azetidine, pyrrolidine, 2,5-dimethylpyrrolidine, 3-pyrrolidinol, 2-pyrrolidinemethanol, 3-pyrroline, 2,5-dimethyl-3-pyrroline, piperidine, 1,2,3,6-tetrahydropyridine, 2-methylpiperidine, 2-ethylpiperidine, 3-methylpiperidine, 4-methylpiperidine, 4,4'-bipiperidine, 4,4'-ethylenebipiperidine, 4,4'-trimethylenebipiperidine, 3,3-dimethylpiperidine, 2,6-dimethylpiperidine, 3,5-dimethylpiperidine, 2,2,6,6-tetramethylpiperidine, 1,4-dioxa-8-azaspiro[4.5]decane, 2-piperidinemethanol, 2-piperidine ethanol, 3-hydroxy piperidine, 3-piperidine methanol, 4-hydroxy piperidine, 2,2,6,6-trimethyl-4-piperidinol, 7,7,9,9-tetramethyl-1,4-dioxa-8-azaspiro[4.5]decane-2-methanol, hexamethyleneimine, heptamethyleneimine, piperazine, 2-methylpiperazine, 2,6-dimethylpiperazine, 2,5-dimethylpiperazine, homopiperazine, acetaldehyde ammonia trimer, 1,4,7-triazacyclononane, 1,5,9-triazacyclododecane, CYCLEN, 1,4,8,11-tetraazacyclotetradecane, 1,4,8,12-tetraazacyclopentadecane, HEXACYCLEN, 1,3,3-trimethyl-6-azabicyclo[3.2.1]octane, dodecahydroquinoline, sparteine, 4,4-dimethyloxazolidine, 4-ethyl-2-methyl-2-(3-methylbutyl)oxazolizine, morpholine, 2,6-dimethylmorpholine, 1-aza-12-crown-4,1-aza-15-crown-5,1-aza-18-crown-6,1,4,10-trioxa-7,13-diazacyclopentadecane, 1,4,10,13-tetraxa-7,16-diazacyclooctadecane, thiazolidine, thiomorpholine, N-methylaniline, N-ethylaniline, N-butylaniline, diphenylamine, N-phenylbenzylamine, 1,2-dianilinoethane, N-allylaniline, 2-anilinoethanol, N-ethyl-o-toluidine, N-ethyl-m-toluidine, N-ethyl-p-toluidine, 4-chloro-N-methylaniline, N-methyl-p-anisidine, 4-aminomethylphenol, N-ethyl-2,3-xylidine, N-ethyl-3,4-(methylenedioxy)aniline, 2,4,6-tri-tert-butyl-N-methylaniline, N,N'-diphenyl-1,4-phenylenediamine, N,N'-diphenylbenzidine, 3,3'-(hexafluoroisopropylidene)dianiline, 4,4'-(hexafluoroisopropylidene)dianiline, 2-benzylaniline, 1-amino-4-bromonaphthalene, 1-amino-2-naphthol, 4-amino-1-naphthol, 5-amino-1-naphthol, 3-amino-2-naphthol, 2,2'-dithiobis(1-naphthalene), 2,3-diaminonaphthalene, 1,5-diaminonaphthalene, 1,8-diaminonaphthalene, 1,1'-binaphthyl-2,2'-diamine, 1-aminofluorene, 2-aminofluorene, 2,7-diaminofluorene, 3,7-diamino-2-methoxyfluorene, 2-amino-7-bromofluorene, 2-amino-9-hydroxyfluorene, 2-amino-3-bromo-9-hydroxyfluorene, 1-aminoanthracene, 2-aminoanthracene, 9-aminophenanthrene, 9,10-diaminophenanthrene, 3-aminofluoranthene, 1-aminopyrene, 6-amino chrysene, N,α-dimethylbenzylamine, N-benzyl-α-methylbenzylamine, N-benzylmethylamine, N-ethylbenzylmethylamine, N-isopropylbenzylmethylamine, N-butylbenzylmethylamine, N-tert-butylbenzylmethylamine, dibenzylamine, N,N'-dibenzylethylenediamine, N-methylphenethylamine, N-benzyl-2-phenethylamine, p-methylphenethylamine, N-benzylethanolamine, 2-(benzylamino)cyclohexanemethanol, α-(methylaminomethyl)benzyl alcohol, EPHEDRINE, α-diphenyl-2-pyrrolidinemethanol, 4-benzylpiperazine, 4-phenyl-1,2,3,6-tetrahydropyridine, indoline, 2-methylindoline, 1,2,3,4-tetrahydrocarbazole, 2,3-dimethylindoline, indoline-2-carboxylic acid, 1,2,3,4-tetrahydroquinoline, 1,2,3,4-tetrahydroisoquinoline, 6,7-dimethoxy-1,2,3,4-tetrahydroisoquinoline, iminodibenzyl, 5,6,11,12-tetrahydrodibenz[B,F]azocine, phenozazine, and phenothiazine.

Examples of the tertiary amine include trimethylamine, N,N-dimethylethylamine, N,N-diethylmethylamine, triethylamine, tripropylamine, N,N-dimethylisopropylamine, N,N-diisopropylethylamine, N,N-dimethylbutylamine, N-methyldibutylamine, tributylamine, triisobutylamine, tripentylamine, N,N-dimethylhexylamine, trihexylamine, N,N-dimethyloctylamine, N-methyldioctylamine, trioctylamine, triisooctylamine, triisodecylamine, N,N-dimethylundecylamine, N,N-dimethyldodecylamine, tridodecylamine, N-methyldioctadecylamine, N,N,N',N'-tetramethyldiaminomethane, N,N,N',N'-tetramethylethylenediamine, N,N,N',N'-tetraethylethylenediamine, N,N,N',N'-tetramethyl-1,3-propanediamine, N,N,N',N'-tetraethyl-1,3-propanediamine, N,N,N',N'-tetraethyl-1,3-butanediamine, N,N,N',N'-tetramethyl-1,4-butanediamine, N,N,N',N'-tetramethyl-1,5-pentanediamine, N,N,N',N'-tetramethyl-1,6-hexanediamine, N,N,N',N'-tetrabuthyl-1,6-hexanediamine, tris(dimethylamino)methane, N,N,N',N',N''-pentamethyldiethylenetriamine, N,N-dimethylcyclohexylamine, N,N-diethylcyclohexylamine, N-methyldicyclohexylamine, N-ethyldicyclohexylamine, N,N-dimethylcyclohexanemethylamine, triallylamine, tris(2-methylallyl)amine, N,N,N',N'-tetramethyl-2-butene-1,4-diamine, tetrakisdimethylaminoethylene, perfluoroisobutylamine, tris[2-(2-methoxyethoxy)ethyl]amine, tert-butoxybis(dimethylamino)methane, 2-(diethylamino)ethanol vinyl ether, N,N'-dimethylformamide dimethylacetal, N,N'-dimethylformamide diethylacetal, N,N'-dimethylformamide dipropylacetal, N,N'-dimethylformamide diisopropylacetal, N,N'-dimethylformamide di-tert-butylacetal, N,N'-dimethylformamide dineopentylacetal, N,N'-dimethylformamide dicyclohexylacetal, N,N-dimethylacetamide dimethylacetal, dimethylamino acetaldehyde diethylacetal, diethylamino acetaldehyde diethylacetal, N,N'-bis(2,2-dimethoxyethyl)methylamine, N,N-dimethylethanolamine, N,N-diethylethanolamine, 2-(diisopropylamino)ethanol, 2-(dibutylamino)ethanol, 3-dimethylamino-1-propanol, 3-diethylamino-1-propanol, 1-dimethylamino-2-propanol, 1-diethylamino-2-propanol, 2-dimethylamino-2-methyl-1-propanol, 5-diethylamino-2-pentanol, N-methyldiethanolamine, N-ethyldiethanolamine, N-butyldiethanolamine, 1-[N,N-bis(2-hydroxyethyl)amino]-2-propanol, triisopropanolamine, 3-(dimethylamino)-1,2-propanediol, 3-(diethylamino)-1,2-propanediol, 3-(dipropylamino)-1,2-propanediol, 3-(diisopropylamino)-1,2-propanediol, 2-{[2-(dimethylamino)ethyl]methylamino}ethanol, 1,3-bis(dimethylamino)-2-propanol, N,N,N',N'-tetrakis(2-hydroxypropyl)ethylenediamine, 2-[2-(dimethylamino)ethoxy]ethanol, PENTROL, 1-aziridine ethanol, 1-methylpyrrolidine, 1-butyl pyrrolidine, 1-pyrrolidino-1-cyclopentene, 1-pyrrolidino-1-cyclohexene, 1-(2-hydroxyethyl)pyrrolidine, 3-pyrrolidino-1,2-propanediol, 1-methyl-3-pyrrolidinol, 1-ethyl-3-pyrrolidinol, 1-methyl-2-pyrrolidinemethanol, 2-methyl-1-pyrroline, 1-methylpiperidine, 1-ethylpiperidine, dipiperidinomethane, 1-ethylpiperidine, 1,1'-methylenebis(3-methylpiperidine), 4,4'-trimethylenebis(1-methylpiperidine), 1,2,2,6,6-pentamethylpiperidine, 1-piperidineacetaldehyde diethyl acetal, 1-piperidine ethanol, 3-piperidino-1,2-propanediol, 3-hydroxy-1-methylpiperidine, 1-ethyl-3-hydroxypiperidine, 1-methyl-3-piperidinemethanol, 4,4'-trimethylenebis(1-piperidineethanol), N,N'-bis(2,2,6,6-tetramethyl-4-piperidinyl)-1,6-hexadiamine, 1,2,3,6-tetrahydropyridine, 1,4-dimethylpiperazine, 4-(dimethylamino)-1,2,2,6,6-pentamethylpiperazine, 1,4-bis(2-hydroxyethyl)piperazine, 1,3,5-tetramethylhexahydro-1,3,5-triazine, 1,3,5-tetraethylhexahydro-1,3,5-triazine, 1,4,7-trimethyl-1,4,7-triazacyclononane, 1,5,9-trimethyl-1,5,9-triazacyclododecane, 1,4,8,11-tetramethyl-1,4,8,11-tetraazacyclotetradecane, 1,4,7,10,13,16-hexamethyl-1,4,7,10,13,16-hexaazacyclooctadecane, TROPANE, QUINULIDINE, 3-QUINULIDINOL, 1,4-diazabicyclo[2.2.2]octane, hexamethylenetetramine, 4-methylmorpholine, 4-ethylmorpholine, 4-(1-cyclopentene-1-yl)morpholine, 1-morpholino-1-cyclohexene, 1-morpholino-1-cycloheptene, 4-(2-hydroxyethyl)morpholine, 3-morpholino-1,2-propanediol, 4-[2-(dimethylamino)ethyl]morpholine, 5-ethyl-1-aza-3,7-dioxabicyclo[3.3.0]octane, 1-aza-3,7-dioxabicyclo[3.3.0]octane-5-methanol, 4,7,13,18-tetraoxa-1,10-diazabicyclo[8.5.5]eicosane, 4,7,13,16,21-pentaoxa-1,10-diazabicyclo[8.8.5]tricosane, 4,7,13,16,21,24-hexaoxa-1,10-diazabicyclo[8.8.8]hexacosane, N,N-dimethylaniline, N-ethyl-N-methylaniline, N,N-diethylaniline, N,N-dibutylaniline, 1-phenylpiperidine, triphenylamine, N-benzyl-N-ethylaniline, 2-(N-ethylanilino)ethanol, N-phenyldiethanolamine, N-(ethoxyethyl)-N-methylaniline, N,N-dimethyl-o-toluidine, N,N-dimethyl-m-toluidine, N,N-dimethyl-p-toluidine, N,N-diethyl-o-toluidine, N,N-diethyl-m-toluidine, N,N-diethyl-p-toluidine, 3-dimethylaminophenol, 3-diethylaminophenol, 2-(N-ethyl-m-toluidino)ethanol, 4-tert-butyl-N,N-dimethylaniline, 4-bromo-N,N-dimethylaniline, 2,2'-(p-tolylimino)dimethanol, 4-(dimethylamino)phenethyl alcohol, N,N,N',N'-tetramethylbenzidine, N,N'-diglycidyl-4-glycidyloxyaniline, 2,6-diisopropyl-N,N-dimethylaniline, 4-bromo-N,N-dimethyl-3-(trifluoromethyl)aniline, N,N,3,5-tetramethylaniline, N,N,2,4,6-pentamethylaniline, 4,4'-methylenebis(2,6-diisopropyl-N,N-dimethylaniline), 2,6-di-tert-butyl-4-(dimethylaminomethyl)phenol, N,N,N',N'-tetramethyl-1,4-phenylenediamine, 4,4'-methylenebis(N,N-dimethylaniline), 4,4'-methylenebis(N,N-diglycidylaniline), 4,4'-vinylidenebis(N,N-dimethylaniline), leucomalachite green, 4,4'-bis(dimethylamino)benzhydrol, 1,8-bis(dimethylamino)naphthalene, 2-(dimethylamino)fluorene, N,N-dimethyl-1-phenethylamine, 3-(N-benzyl-N-methylamino)-1,2-propanediol, N,N-dimethylbenzylamine, N,N,N',N'-tetrabenzylmethanediamine, N-methyldiphenylethyleneamine, tribenzylamine, N-(2-chloroethyl)dibenzylamine, N-benzyl-N-methylethanolamine, 3-dibenzylamino-1-propanol, 2-dibenzylamino-3-phenyl-1-propanol, N-ethyl-3,3'-diphenyldipropylamine, 3-methoxy-N,N-dimethylbenzylamine, 4-bromo-N,N-diisopropylbenzylamine, 1-(diphenylmethyl)azetidine, 1-benzyl-3-pyrroline, 1-benzyl-3-pyrrolidinol, 1-benzyl-2-pyrrolidinemethanol, 1-(3,4-dihydro-2-naphthyl)pyrrolidine, 1-methyl-4-phenyl-1,2,3,6-tetrahydropyridine, 4-diphenylmethoxy-1-methylpiperazine, 1-benzyl-4-hydroxypiperazine, 1,3,5-tribenzylhexahydro-1,3,5-triazine, 4-phenylmorpholine, 2,5-dimethyl-4-(morpholinomethyl)phenol, N,N'-dibenzyl-1,4,10,13-tetraoxa-7,16-diazacyclooctadecane, 2-methylene-1,3,3-trimethylindoline, JULODINE, 8-hydroxy JULODINE, 5,10-dihydro-5,10-dimethylphenazine, 10-methylphenothiazine, TROGER'S BASE, and 5,6-benzo-4,7,13,16,21,24-hexaoxa-1,10-diazabicyclo[8.8.8]hexacosane.

Examples of other usable amines further include amine compounds having a combination of primary amino groups, secondary amino groups, and tertiary amino groups in one molecule, including N-methylethylenediamine, N-ethylethylenediamine, N-propylethylenediamine, N-isopropylethylenediamine, N,N-dimethylethylenediamine, N,N-diethylethylenediamine, N,N-dibutylethylenediamine, N,N,N'-trimethylethylenediamine, N,N-dimethyl-N'-ethylethylenediamine, N,N-diethyl-N'-methylethylenediamine, N,N,N'-triethylethylenediamine, N-methyl-1,3-propanediamine, N-ethyl-1,3-propanediamine, N-propyl-1,3-propanediamine, N-isopropyl-1,3-propanediamine, 3-dimethylaminopropylamine, 3-diethylaminopropylamine, 3-dibutylaminopropylamine, N,N,N'-trimethyl-1,3-propanediamine, N,N,2,2-tetraethyl-1,3-propanediamine, 2-amino-5-diethylaminopentane, diethylenetriamine, N1-isopropyldiethylenetriamine, N,N,N',N'-tetraethyldiethylenetriamine, N-(2-aminoethyl)-1,3-propanediamine, 3,3'-diamino-N-methyldipropylamine, N-(3-aminopropyl)-1,3-propanediamine, 3,3'-iminobis(N,N-dimethylpropylamine), SPERMIDINE, bis(hexamethylene)triamine, N,N',N'''-trimethylbis(hexamethylene)triamine, 4-(aminomethyl)-1,8-octanediamine, triethylenetetramine, 1,1,4,7,10,10-hexamethyltriethylenetetramine, N,N'-bis(3-aminopropyl)ethylenediamine, N,N'-bis(2-aminoethyl)-1,3-propanediamine, N,N'-bis(3-aminopropyl)-1,3-propanediamine, SPERMINE, tris(2-aminoethyl)amine, tetraethylenepentamine, pentaethylenehexamine, N-cyclohexyl-1,3-propanediamine, 2-(2-aminoethylamino)ethanol, 1-(2-aminoethyl)pyrrolidine, 2-(2-aminoethyl)-1-methylpyrrolidine, 1-(2-pyrrolidinylmethyl)pyrrolidine, 4-(1-pyrrolidinyl)piperidine, 4-piperidinopiperidine, 1-(2-aminoethyl)piperidine, 1-(3-aminopropyl)-2-pipecholine, 3-aminopiperidine, 1-methyl-4-(methylamino)piperidine, 4-(aminoethyl)piperidine, 3-(4-aminobutyl)piperidine, 4-amino-2,2,6,6-tetramethylpiperidine, 4-dimethylamino-2,2,6,6-tetramethylpiperidine, 2-methyl-2-imidazoline, 4,4-dimethyl-2-imidazoline, 1-methylpiperazine, 1-ethylpiperazine, 1-(2-hydroxyethyl)piperazine, 1-[2-(2-hydroxyethoxy)ethyl]piperazine, 1-(2-aminoethyl)piperazine, 1,4-bis(3-aminopropyl)piperazine, HEXETIDIEN, 1,4,5,6-tetrahydropyrimidine, 1-methylhomopiperazine, 3-aminoquinoizine, 1,8-diazabicyclo[5.4.0]undec-7-sene, 1,3,4,6,7,8-hexahydro-2H-pyrimide[1,2-A]pyrimidine, 1,3,4,6,7,8-hexahydro-1-methyl-2H-pyrimide[1,2-A]pyrimidine, 4-(2-aminoethyl)morpholine, 4-(3-aminopropyl)morpholine, 5,6-dihydro-2-isopropenyl-4,4,6-trimethyl-4H-1,3-oxazine, N-methyl-1,2-phenylenediamine, N-phenyl-1,2-phenylenediamine, N,N-dimethyl-1,3-phenylenediamine, N,N-dimethyl-1,4-phenylenediamine, N,N-diethyl-1,4-phenylenediamine, N4,N4-diethyl-2-methyl-1,4-phenylenediamine, 2-methoxy-N4-phenyl-1,4-phenylenediamine, N-phenyl-1,4-phenylenediamine, N-methyl-4,4'-methylenedianiline, N-phenylethylenediamine, N'-benzyl-N,N-dimethylethylenediamine, N,N',N''-tribenzyltris(2-aminoethyl)amine, 4-(hexadecylamino)benzylamine, 4-dimethylaminobenzylamine, 4-amino-1-benzylpiperazine, 2-phenyl-2-imidazoline, tolazoline, 2-(1-naphthylmethyl)-2-imidazoline, phentolamine, 2,3-diphenyl-1,4-diazaspiro[4.5]deca-1,3-diene, 4-benzyl-2-methyl-2-oxazoline, 4,4-dimethyl-2-phenyl-2-oxazoline, 4-methoxymethyl-2-methyl-5-phenyl-2-oxazoline, 2-methyl-5-phenyl-2-oxazoline-4-methanol, 2,2'-bis[(4S)-4-benzyl-2-oxazoline], 2,2'-bis[(4S)-4-phenyl-2-oxazoline], 2,2'-isopropylidenebis[(4S)-4-phenyl-2-oxazoline], 2,2'-methylenebis[(4R,5S)-4,5-diphenyl-2-oxazoline], tetramisole, 1-phenylpiperazine, 5-phenyl-1,4,5,6-tetrahydropyrimidine, 1-benzylpiperazine, 1-cinnamylpiperazine, 1-o-tolylpiperazine, 1-(2,3-xylyl)piperazine, 1-(2-methoxy)piperazine, 1-(4-methoxy)piperazine, 1-(2-ethoxy)piperazine, 4-morpholino aniline, homocaine, polyethyleneimine, and polyethyleneimine-graft polyalkyl (meth)acrylate copolymer.

Examples of the above amine further include nitroamine, commercially available modified amine, and modified polyamine. Examples of the nitroamine include 2-nitroaniline, 3-nitroaniline, 4-nitroaniline, and 1-(4-nitrophenyl)piperazine.

Examples of the above quaternary ammonium hydroxide include tetramethylammonium hydroxide, tetraethylammonium hydroxide, tetrapropylammonium hydroxide, tetrabutylammonium hydroxide, triethylmethylammonium hydroxide, hexadecyltrimethylammonium hydroxide, and benzyltrimethylammonium hydroxide.

Examples of the hydrazine compound include phenylhydrazine, 1,1-diphenylhydrazine, 1,2-diphenylhydrazine, 1-methyl-1-phenylhydrazine, and o-tolylhydrazine.

Examples of the amide compound include malonamide, succinamide, fumaric acid amide, adipic acid amide, NIPECITANIDE, copolymer of alkyl(meth)acrylate and (meth)acryloylamide, copolymer of styrene, alkyl(meth)acrylate and (meth)acryloylamide, copolymer of alkyl(meth)acrylate and (meth)acryloylmorpholine, and copolymer of styrene, alkyl(meth)acrylate and (meth) acryloylmorpholine.

Examples of the mercapto compound include 1,2-ethanedithiol, 1,3-propanedithiol, 1,4-butanedithiol, 1,5-pentanedithiol, 1,6-hexanedithiol, 1,8-octanedithiol, 1,9-nonanedithiol, 2-mercaptoethyl ether, 1,2-benzenedithiol, 1,3-benzenedithiol, 1,4-benzenedithiol, 1,2-benzenedimethanethiol, 1,3-benzendimethanethiol, 1,4-benzenedimethanethiol, and 4,4'-thiobenzenethiol.

Examples of the sulfide compound include ethyl disulfide, methyl propyl disulfide, isopropyl disulfide, and phenyl disulfide.

Examples of the phosphine compound include di-tert-butylphosphine, trimethylphosphine, 1,2-bis(dimethylphosphino)ethane, triethylphosphine, tripropylphosphine, triisopropylphosphine, triisobutylphosphine, tri-tert-butylphosphine, trioctylphosphine, tricyclohexylphosphine, 1,4-bis(dicyclohexylphosphino)butane, phenylphosphine, diphenylphosphine, triphenylphosphine, 1,2-bis(phenylphosphino)ethane, dimethylphenylphosphine, diethylphenylphosphine, diallylphenylphosphine, methyldiphenylphosphine, ethyldiphenylphosphine, diphenylpropylphosphine, isopropyldiphenylphosphine, diphenylvinylphosphine, allyldiphenylphosphine, dicyclohexylphenylphosphine, tribenzylphosphine, tri-o-tolylphosphine, tri-m-tolylphosphine, tri-p-tolylphosphine, tris(2,4,6-trimethylphenyl)phosphine, bis(diphenylphosphino)methane, 1,2-bis(diphenylphosphino)ethane, 1,3-bis(diphenylphosphino)propane, 1,4-bis(diphenylphosphino)butane, and 2,2'-bis(diphenylphosphino)-1,1'-naphthalene.

The above basic compound (a2) is preferably an amine. Use of the amine makes it possible to cure the curable compound (B) even more rapidly.

The amine as the above basic compound (a2) preferably has at least two amino groups in one molecule. This makes it possible to cure the curable compound (B) even more rapidly.

An amine as the basic compound (a2) is preferably an amine represented by any one of the following formulae (2) to (7). This makes it possible to cure the curable compound (B) even more rapidly.

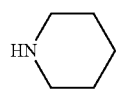 (2)

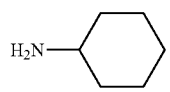 (3)

$(CH_3)_4N^+OH^-$ (4)

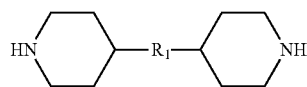 (5)

$R_1$ in the above formula (5) is a $C_1$-$C_{10}$ alkylene group.

$H_2N-R_2-NH_2$ (6)

$R_2$ in the above formula (6) is a $C_1$-$C_{10}$ alkylene group.

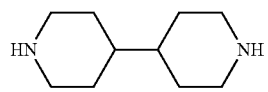 (7)

(Curable Compound (B))

The photobase generator (A) in the present invention is used in combination with the curable compound (B) that has, in one molecule thereof, at least two functional groups selected from among epoxy group, (meth)acryloyl group, isocyanato group, acid anhydride group, and alkoxysilyl group. The curable compound (B) having at least two of these functional groups in one molecule is effectively activated by a base generated from the photobase generator (A) and is cured rapidly. The curable compound (B) may be used alone or in combination of two or more kinds thereof.

Note that "(meth)acryloyl" herein refers to acryloyl or methacryloyl. "(meth)acryl" refers to acryl or methacryl. "(meth)acrylate" refers to acrylate or methacrylate.

The curable compound (B) is preferably a compound having epoxy groups or isocyanato groups. Such a preferable compound makes it easier to balance the curability of the composition and the cohesion and adhesion of a cured product to a substrate. Among the preferable compounds, an urethane prepolymer having isocyanato groups is particularly suitable. The urethane prepolymer further makes it easier to balance the curability of the composition and the cohesion and adhesion of the cured product to the substrate.

Examples of the curable compound (B) having at least two (meth)acryloyl groups in one molecule include urethane acrylates obtained in reactions such as a reaction between a compound having an isocyanato group and a (meth)acrylic monomer having active hydrogen, epoxy ester compounds obtained in reactions such as a reaction between a compound having plural epoxy groups and a (meth)acryl acid or a (meth)acrylic monomer having a hydroxyl group, polyester acrylates, alkylene glycol di(meth)acrylates, polyalkylene glycol di(meth)acrylates, polyol (meth)acrylates, silicone acrylates, polybutadiene acrylates, ethylene oxide added bisphenol A dimethacrylates, trimethylolpropane PO-modified trimethacrylates, and trimethylolpropane EO-modified trimethacrylates.

Examples of the above alkylene glycol di(meth)acrylates include ethylene glycol dimethacrylate, 1,4-butanediol dimethacrylate, 1,6-hexanediol dimethacrylate, and 1,9-nonanediol dimethacrylate.

Examples of the polyalkylene glycol di(meth)acrylates include polyethylene glycol di(meth)acrylate, polypropylene glycol di(meth)acrylate, and polytetramethylene glycol di(meth)acrylate.

Examples of the polyol (meth)acrylates include glycerin di(meth)acrylate, glycerin tri(meth)acrylate, trimethylol propane tri(meth)acrylate, ditrimethylol propane tetraacrylate, pentaerythritol triacrylate, pentaerythritol tetraacrylate, dipentaerythritol pentaacrylate, and dipentaerythritol hexaacrylate.

Examples of the curable compound (B) having at least two isocyanato groups include tetramethylene diisocyanate, hexamethylene diisocyanate, octamethylene diisocyanate, dodecamethylene diisocyanate, 1,5-diisocyanate-2-methylpentane, 1,3-bis(isocyanatomethyl)cyclohexane, 1,4-cyclohexene diisocyanate, 4,4'-methylenebis(cyclohexyl isocyanate), isophorone diisocyanate, 1,3-phenylene diisocyanate, 1,4-phenylene diisocyanate, tolylene-2,4-diisocyanate, tolylene-2,6-diisocyanate, 1-chloromethyl-2,4-diisocyanatobenzene, 4,4'-methylenebis(2,6-diethylphenylisocyanate), 4,4'-methylenebis(phenylisocyanate), 4,4'-oxybis(phenylisocyanate), 1,5-naphthylenediisocyanate, copolymer of styrene and 3-(meth)acryloyloxypropyl isocyanate, copolymer of alkyl(meth)acrylate and 3-(meth)acryloyloxypropyl isocyanate, copolymer of styrene, alkyl(meth)acrylate, and 3-(meth)acryloyloxypropyl isocyanate, and urethane prepolymer.

Examples of a method for producing the urethane prepolymer include a method of mixing a polyhydroxy compound and a polyisocyanate compound, and reacting the mixture for 3 to 5 hours at about 80 to 100° C. under a nitrogen stream. The polyhydroxy compound and the polyisocyanate compound are preferably mixed such that a ratio (NCO/OH) of an isocyanato group (NCO) of the polyisocyanate compound to a hydroxy group (OH) of the polyhydroxy compound is 1.2 to 15 at the equivalence ratio. The above ratio (NCO/OH) is preferably within the range of 3 to 12 at the equivalence ratio.

The NCO/OH of less than 1.2 at the equivalence ratio may excessively increase viscosity of an urethane prepolymer to be produced, and may make it difficult to use the photocurable composition as an adhesive. The NCO/OH of more than 15 at the equivalence ratio may easily cause the photocurable composition to bubble at the time of curing, which may decrease the cohesion force of a cured product and lead to insufficient adhesive strength.

Examples of the curable compound (B) having at least two anhydride groups in one molecule include bicyclo[2.2.2]oct-7-ene-2,3,5,6-tetracarboxylic acid dianhydride, ethylenediaminetetraacetic acid dianhydride, diethylenetriaminepentaacetic acid dianhydride, 3,3',4,4'-benzophenonetetracarboxylic acid dianhydride, 4,4'-(hexafluoroisopropylidene)diphthalic acid anhydride, 1,2,4,5-benzenetetracarboxylic acid dianhydride, 1,4,5,8-naphthalene tetracarboxylic acid dianhydride, 3,4,9,10-perylene tetracarboxylic acid dianhydride, pyromellitic acid anhydride, copolymer of styrene and maleic acid anhydride, copolymer of alkyl(meth)acrylate and maleic acid anhydride, copolymer of styrene, alkyl(meth)acrylate and maleic acid anhydride, reaction product of tetracarboxylic acid dianhydride and a diamine, and reaction product of tetracarboxylic acid dianhydride and a diol.

Examples of the curable compound (B) having at least two alkoxysilyl groups in one molecule include tetramethoxysilane, tetraethoxysilane, tetraisopropoxysilane, trimethoxysilane, methyltrimethoxysilane, triethoxysilane, ethyltriethoxysilane, dimethoxydimethylsilane, cyclohexyldimethoxymethylsilane, diethoxydimethylsilane, dimethoxymethyloctylsilane, diethoxymethylvinylsilane, chloromethyl(diisopropoxy)methylsilane, dimethoxymethylphenylsilane, diethoxydiphenylsilane, trimethoxypropylsilane, isobutyltrimethoxysilane, octyltrimethoxysilane, octadecyltrimethoxysilane, methyltriethoxysilane, isobutyltriethoxysilane, octyltriethoxysilane, vinyltrimetoxysilane, vinyltriethoxysilane, allyltriethoxysilane, (3-chloropropyl)trimethoxysilane, chloromethyltriethoxysilane, tris(2-methoxyethoxy)vinylsilane, 3-glycidoxypropyltrimethoxysilane, diethoxy(3-glycidoxypropyl)methylsilane, trimethoxy[2-(7-oxabicyclo[4.1.0]hept-3-yl)ethyl]silane, chlorotrimethoxysilane, chlorotriethoxysilane, chlorotris(1,3-dimethylbutoxy)-silane, dichlorodiethoxysilane, 3-(triethoxysilyl)propionitrile, 4-(triethoxysilyl)butyronitrile, 3-(triethoxysilyl)propyl isocyanate, 3-(triethoxysilyl)propyl thioisocyanate, phenyltrimethoxysilane, phenyltriethoxysilane, tetrapropoxysilane, tetrabutoxysilane, 1,3,5,7-tetraethoxy-1,3,5,7-tetramethylcyclotetrasiloxane, 1,3,5,7-tetramethyl-1,3,5,7-tetraproxycyclotetrasiloxane, 1,3,5,7-tetraisopropoxy-1,3,5,7-tetramethylcyclotetrasiloxane, 1,3,5,7-tetrabutoxy-1,3,5,7-tetramethylcyclotetrasiloxane, 1,3,5,7,9-pentaethoxy-1,3,5,7,9-pentamethylcyclopentasiloxane, octamethylcyclotetrasiloxane, decamethylcyclopentasiloxane, dodecamethylcyclohexasiloxane, hexaphenylcyclotrisiloxane, octaphenylcyclotetrasiloxane, 1,3,5,7-tetramethylcyclotetrasiloxane, 1,3,5,7-tetramethyl-1,3,5,7-tetraphenylcyclotetrasiloxane, 1,1,3,3,5,5-hexamethylcyclotrisilazane, 1,1,3,3,5,5,7,7-octamethylcyclotetrasilazane, 1,7-diacetoxyoctamethyltetrasiloxane, 1,7-dichlorooctamethyltetrasiloxane, 1,1,3,3,5,5-hexamethyl-1,5-dichlorotrisiloxane, 1,3-dichlorotetraisopropyldisiloxane, 1,3-diethoxytetramethyldisiloxane, 1,3-dimethoxytetramethyldisiloxane, 1,1,3,3-tetramethyl-1,3-dichlorodisiloxane, 1,2-bis(methyldichlorosilyl)ethane, diacetoxydiphenylsilane, methyltris(ethylmethylketoxime)silane, methyltris(N,N-diethylaminoxy)silane, bis(ethylmethylketoxime)methylisopropoxysilane, bis(ethylmethylketoxime)ethoxymethylsilane, 2-(3,4-epoxycyclohexylethyl)trimethylsilane, tris(1-methylvinyloxy)vinylsilane, methyltriisopropenoxysilane, ethyltriacetoxysilane, methyltriacetoxysilane, diacetoxydimethylsilane, triacetoxyvinylsilane, tetraacetoxysilane, diacetoxymethylphenylsilane, dimethoxyethylmethylketoximemethylsilane, bis(trimethoxysilyl)benzene, bis(triethoxysilyl)benzene, tris(trimethoxysilyl)benzene, tris(triethoxysilyl)benzene, bis(trimethoxysilyl)biphenyl, bis(triethoxysilyl)biphenyl, tris(trimethoxysilyl)biphenyl, tris(triethoxysilyl)biphenyl, bis(trimethoxysilyl)naphthalene, bis(triethoxysilyl)naphthalene, tris(trimethoxysilyl)naphthalene, tris(triethoxysilyl)naphthalene, bis(methyldimethoxysilyl)benzene, bis(methyldiethoxysilyl)benzene, tris(methyldimethoxysilyl)benzene, tris(methyldiethoxysilyl)benzene, bis(methyldimethoxysilyl)biphenyl, bis(methyldiethoxysilyl)biphenyl, tris(methyldimethoxysilyl)biphenyl, tris(methyldiethoxysilyl)biphenyl, bis(methyldimethoxysilyl)naphthalene, bis(methyldiethoxysilyl)naphathalene, tris(methyldimethoxysilyl)naphthalene, tris(methyldiethoxysilyl)naphthalene, tris(dimethylmethoxysilyl)benzene, tris(dimethylmethoxysilyl)biphenyl, tris(dimethylmethoxysilyl)naphthalene, bis(trimethoxysilylethynyl)benzene, bis(methyldiethoxysilylethynyl)benzene, tris(trimethoxysilylethynyl)benzene, tris(methyldimethoxysilylethynyl)benzene, bis(trimethoxysilylpropyl)benzene, bis(methyldiethoxysilylpropyl)benzene, tris(trimethoxysilylpropyl)benzene, tris(methyldimethoxysilylpropyl)benzene, bis(trimethoxysilyl)methane, bis(methyldimethoxysilyl)methane, bis(trimethoxysilyl)ethane, bis(methyldimethoxysilyl)ethane, bis(trimethoxysilyl)propane, bis(methyldimethoxysilyl)propane, bis(trimethoxysilyl)butane, bis(methyldimethoxysilyl)butane, bis(trimethoxysilyl)pentane, bis(methyldimethoxysilyl)pentane, bis(trimethoxysilyl)hexane, bis(methyldimethoxysilyl)hexane, bis(trimethoxysilyl)heptane, bis(methyldimethoxysilyl)heptane, bis(trimethoxysilyl)octane, bis(methyldimethoxysilyl)octane, bis(trimethoxysilylpropyl)amine, bis(methyldimethoxysilylpropyl)amine, bis(trimethoxysilylpropyl)ethylenediamine, bis(methyldimethoxysilylpropyl)ethylenediamine, tris(trimethoxysilylpropyl)isocyanurate, hexamethoxydisilane, methyldimethoxydisilane, hexaethoxydisilane, methyldiethoxydisilane, dimethoxytetramethyldisiloxane, trimethoxytrimethyldisiloxane, tetramethoxydimethyldisiloxane, pentamethoxymethyldisiloxane, hexamethoxydisiloxane, dimethoxyhexamethyltrisiloxane, trimethoxypentamethyltrisiloxane, tetramethoxytetramethyltrisiloxane, pentamethoxytrimethyltrisiloxane, hexamethoxydimethyltrisiloxane, heptamethoxymethyltrisiloxane, octamethoxytrisiloxane, 1,3,5,7-tetramethoxy-1,3,5,7-tetramethylcyclotetrasiloxane, octamethoxycyclotetrasiloxane, 1,3,5,7-tetraethoxy-1,3,5,7-tetramethylcyclotetrasiloxane, octaethoxycyclotetrasiloxane, octakis(trimethoxysilylethynyl)-T8-silsesquioxane, octakis(methyldimethoxysilylethynyl)-T8-silsesquioxane, octakis(dimethylmethoxysilylethynyl)-T8-silsesquioxane, bis(methyldimethoxysilyl)polypropyleneglycol, bis(trimethoxysilyl)polypropyleneglycol, bis(methyldimethoxysilyl)

polyisobutylene, (meth)acrylate having alkoxysilyl groups, copolymer of styrene and 3-(trimethoxysilyl)propyl(meth) acrylate, copolymer of alkyl(meth)acrylate, 3-(trimethoxysilyl)propyl(meth)acrylate, styrene, alkyl(meth)acrylate, and 3-(trimethoxysilyl)propyl(meth)acrylate, copolymer of styrene and 3-(methyldimethoxysilyl)propyl(meth)acrylate, and copolymer of alkyl(meth)acrylate, 3-(methyldimethoxysilyl)propyl(meth)acrylate, styrene, alkyl(meth)acrylate and 3-(methyldimethoxysilyl)propyl(meth)acrylate.

The above curable compound (B) having at least two epoxy groups in one molecule is not particularly limited. Examples the curable compound (B) having at least two epoxy groups in one molecule include glycidyl ether epoxy resin, glycidyl ester epoxy resin, glycidyl amine epoxy resin, alicyclic epoxy resin, epoxidized SBS, and epoxidized butadiene. Among these, at least one kind selected from the glycidyl ether epoxy resin, glycidyl ester epoxy resin, and glycidyl amine epoxy resin is suitably used. When such a preferable curable compound is used, the curable compound can be effectively activated by the base generated from the photobase generator (A) and can be rapidly cured.

Examples of the above glycidyl ether epoxy resin include bisphenol A epoxy resin, bisphenol F epoxy resin, bisphenol S epoxy resin, hydrogenated bisphenol A epoxy resin, hydrogenated bisphenol F epoxy resin, hydrogenated bisphenol S epoxy resin, phenol novolac epoxy resin, brominated phenol novolac epoxy resin, 1,1,2,2-tetrakis(4-glycidyloxyphenyl) ethane, trimethylolpropane triglycidyl ether, neopentyl glycol diglycidyl ether, polypropylene glycol diglycidyl ether, polyethylene glycol diglycidyl ether, and 1,4-butanedioldiglycidyl ether.

Examples of the above glycidyl ester epoxy resins include cyclohexane-1,2-dicarboxylic acid diglycidyl ester, 1,2,3,6-tetrahydrophtal acid diglycidyl ester, phthalic acid diglycidyl ester, and 1,2,3,6-tetrahydro-4-methylphthalic acid diglycidyl ester.

Examples of the above glycidyl amine epoxy resin include 4,4'-methylenebis(N,N-diglycidylaniline), N,N-diglycidyl-2-glycidyloxyaniline, N,N-diglycidylaniline, 2-methyl-N,N-diglycidylaniline, and N,N',N"-triglycidyl isocyanurate.

The blending amount of the photobase generator (A) is preferably within the range of 1 to 200 parts by weight, more preferably 10 to 150 parts by weight, still more preferably 15 to 100 parts by weight, and particularly preferably 20 to 80 parts by weight per 100 parts by weight of the above curable compound (B).

When the amount of the photobase generator (A) is too small, the amount of the base to be generated by light irradiation may also be very small, and thus the curable compound (B) may not be cured sufficiently. On the other hand, when the amount of the photobase generator (A) is too large, the amount of the base to be generated by light irradiation may also be very large, and a part of the base may not react with the functional group of the curable compound (B), which may lead to an insufficient degree of crosslinking.

The amount of the basic functional groups of the basic compound (a2) to be generated upon complete photodegradation of the photobase generator (A) is preferably within the range of 0.01 to 2 mole per a total of 1 mole of functional groups selected from among epoxy group, (meth)acryloyl group, isocyanato group, acid anhydride group, and alkoxysilyl group in the curable compound (B).

The molar ratio of the total number of moles of functional groups selected from among epoxy group, (meth)acryloyl group, isocyanato group, acid anhydride group, and alkoxysilyl group in the curable compound (B) to the total number of moles of basic functional groups in the basic compound (a2) is within the range of 1:0.01 to 1:2.

When the amount of the number of moles of the basic functional groups is too small, the amount of the base to be generated by light irradiation may also be very small, and thus the curable compound (B) may not be cured sufficiently. On the other hand, when the amount of the number of moles of the basic functional groups is too large, the amount of the base to be generated by light irradiation may also be very large, and a part of the base may not react with the functional group of the curable compound (B), which may lead to an insufficient degree of crosslinking.

Further, the value (number-average molecular weight/the number of functional groups) (hereinafter, the value is also referred to as a functional group equivalent) calculated by dividing the number-average molecular weight of the curable compound (B) by the total number of functional groups of among epoxy group, (meth)acryloyl group, isocyanato group, acid anhydride group, and alkoxysilyl group is preferably within the range of 170 to 50000. A functional group equivalent of less than 170 cures the curable compound (B), but may easily generate residual unreacted functional groups. A functional group equivalent of less than 170 also causes the crosslinking density of the cured product to be significantly high, which may destabilize the adhesion of the photocurable composition and lead to insufficient adhesive strength between the cured product and adherends when the adherends are bonded with the cured product. A functional group equivalent of more than 50000 causes a reaction in the curable compound (B), but may result in insufficient crosslinking. In this case, too, the adhesive strength between the cured product and the adherends may be insufficient. The above functional group equivalent is more preferably within the range of 180 to 20000, and is still more preferably within the range of 250 to 10000. In the case of using several kinds of the curable compounds (B), the above functional group equivalent is calculated as an average value in accordance with the later-described evaluation method.

(Base Proliferating Agent (C))

The photocurable composition according to the present invention preferably further comprises a base proliferating agent (C) that generates a base in a proliferating way upon an action of the base.

Examples of the above base proliferating agent (C) include 9-fluorenylcarbamate derivatives of a bifunctional type, a spherical polyfunctional oligomer type, a linear chain polymer type, or a siloxane type.

The 9-fluorenylcarbamate derivative can be produced by, for example, an addition reaction between 1,6-hexamethylenediisocyanate and an isocyanate derivative. Examples of the isocyanate derivative include methaxylene diisocyanate, tolylene diisocyanate, isophorone diisocyanate, 1,6-hexamethylene diisocyanate, 2-(meth)acryloyl oxyethylisocyanate, and copolymer containing 2-(meth)acryloyl oxyethylisocyanate. Each of these 9-fluorenylcarbamate derivatives may be used alone in combination of two or more kinds thereof.

The base proliferating agent (C) is preferably a base proliferating agent (C1) that has a base proliferating group represented by the following formula (10).

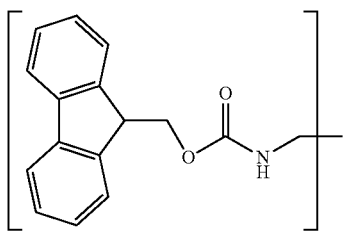

(10)

The base proliferating agent (C1) having the base proliferating group represented by the above formula (10) is degraded by a base proliferating reaction to newly generate an amine. The generated amine then functions as a new catalyst to generate a large number of new amines in a proliferating way. That means that the larger the number of the base proliferating groups represented by the above formula (10) in a molecule, the better the efficiency of the base proliferating reaction in the molecule. Therefore, the generation efficiency of the amino group can be increased.

In a base proliferating reaction in which the base proliferating agent (C1) having the base proliferating group represented by the above formula (10) is used, an active hydrogen atom is abstracted by a base to form carbanion. Next, a carbamic acid is eliminated and the degradation further proceeds to generate an amino group and carbon dioxide. The amino group serves as a catalyst to accelerate the reaction. The reaction is represented by the following scheme (X1).

scheme (X1)

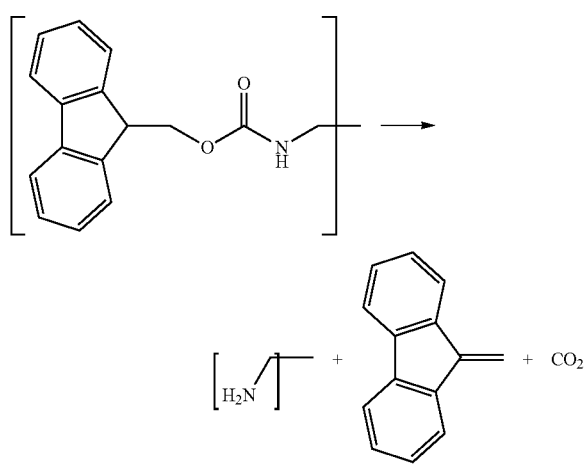

The base proliferating group represented by the above formula (10) is preferably a base proliferating group represented by the following formula (11).

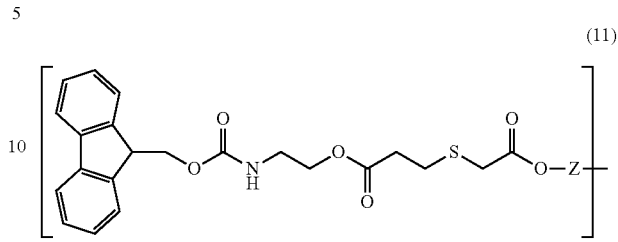

(11)

Z in the above formula (11) represents a substituted or unsubstituted alkylene group.

Specific examples of Z in the above formula (11) include methylene group, ethylene group, and propylene group. Here, Z is preferably an unsubstituted alkylene group because it leads to an effective base proliferating reaction. Among these groups, a methylene group is more preferable as Z because steric hindrance caused by Z tends to be small and the base proliferating reaction tends to occur more effectively.

The base proliferating agent having the base proliferating group represented by the above formula (11) is preferably a base proliferating agent represented by the following formula (12).

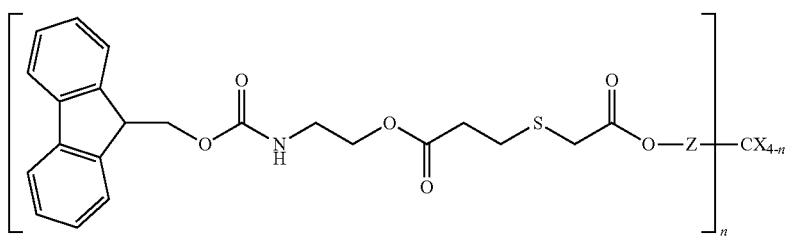

(12)

X in the above formula (12) represents hydrogen, a substituted alkyl group, or an unsubstituted alkyl group. Z represents a substituted or unsubstituted alkylene group, and "n" represents an integer from 1 to 4.

Specific examples of X in the formula (12) include methyl group, ethyl group, or propyl group. X is preferably an unsubstituted alkyl group. This leads to an efficient base proliferating reaction. Further, X is more preferably an ethyl group. This may make the steric hindrance due to X small, thereby leading to a more effective base proliferating reaction.

"n" in the above formula (12) represents an integer from 1 to 4. When the base proliferating agent represented by the above formula (12) has a plurality of 9-fluorenylcarbamate groups in one molecule, the base proliferating reaction tends to occur even more effectively due to the catalytic activity of the generated base. Therefore, "n" in the above formula (12) is preferably 3 or 4.

Specific examples of the base proliferating agent represented by the above formula (12) include a base proliferating agent (Flu3) represented by the following formula (13) and a base proliferating agent (Flu4) represented by the following formula (14). The base proliferating agents represented by the following respective formulae (13) and (14) can be produced in accordance with the method described in WO 2006/095670 A1.

(13)

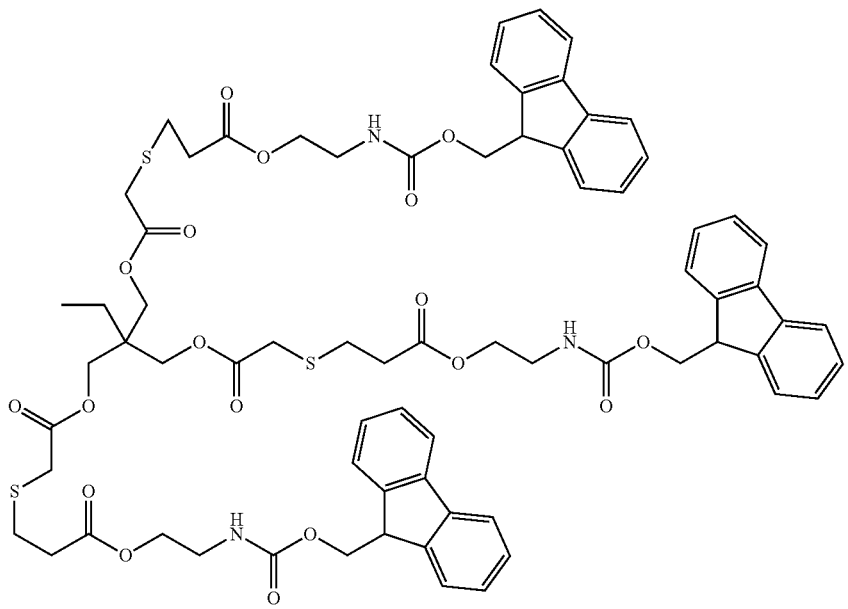

Flu3

(14)

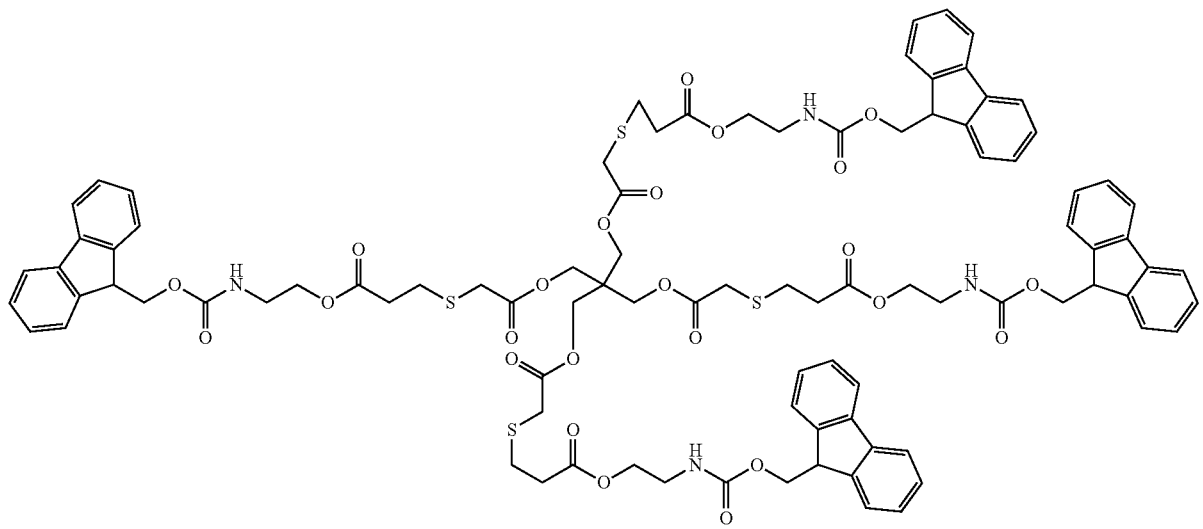

Flu4

The base proliferating agents represented by the respective formulae (13) and (14) each have a plurality of 9-fluorenylcarbamate groups in one molecule. Accordingly, the base proliferating reaction tends to proceed easily due to the catalytic activity of the generated base. The base proliferating agent (C) is more preferably a base proliferating agent represented by the above formula (13), and still more preferably a base proliferating agent represented by the above formula (14). These preferable base proliferating agents make it possible to further increase the generation efficiency of the base.

A method of synthesizing a base proliferating agent having a base proliferating group represented by one of the above formulae (10) and (11) or a base proliferating agent represented by one of the above formulae (12) to (14) is not particularly limited. These base proliferating agents can be synthesized, for example, by an addition reaction between fluorenyl methanol and an isocyanate derivative, or by an addition reaction between an acrylate monomer having a fluorenylcarbamate group and a polythiol derivative. A base proliferating agent can be easily produced by suitably using a tin catalyst for the former addition reaction or by suitably using a base catalyst for the latter addition reaction.

The base proliferating group represented by the above formula (10) is also preferably a base proliferating group represented by the following formula (15).

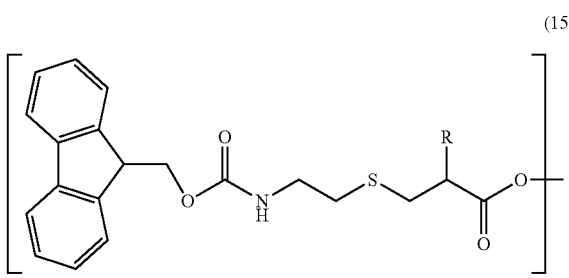

(15)

R in the above formula (15) represents hydrogen or a methyl group.

The base proliferating agent (C1) having a base proliferating group represented by the above formula (10) is more preferably a base proliferating agent that has a base proliferating group represented by the above formula (15) and an unsaturated group represented by the following formula (16).

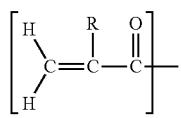

(16)

R in the above formula (16) represents hydrogen or a methyl group.

The base proliferating agent having a base proliferating group represented by the above formula (15) and an unsaturated group represented by the above formula (16) chemically binds to the curable compound (B) by crosslinking. This causes the base proliferating agent to be incorporated into a cured product, and thereby suppresses the contamination due to the residual base proliferating agent.

The base proliferating agent having the base proliferating group represented by the above formula (15) can be produced, for example, by an addition reaction between a compound having an unsaturated group represented by the above formula (16) and 9-fluorenylmethyl N-(2-mercaptoethyl)carbamate, as shown by the following scheme (X2). In this addition reaction, R in the above formula (15) is derived from R of an unsaturated group represented by the above formula (16).

scheme (X2)

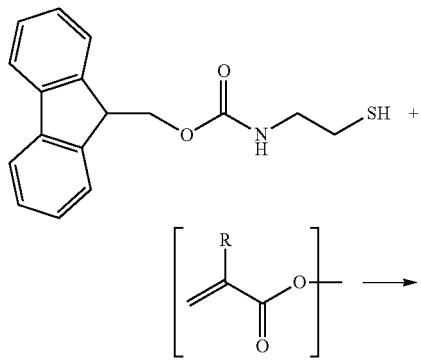

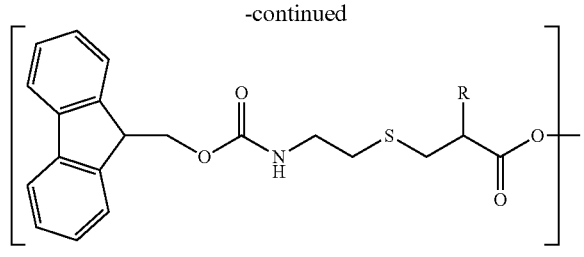

R in the above scheme (X2) represents hydrogen or a methyl group.

The compound having an unsaturated group represented by the above formula (16) is a compound having a (meth)acrylate group.

Examples of the compound having an unsaturated group represented by the above formula (15) include (meth)acrylate monomer and oligomer. These are listed in "Hikarikouka Gijutsu Handbook Zairyou-hen (Photocuring Technology Handbook, Ingredient)" (published by TECHNO-NET, 2000).

When the base proliferating agent has many base proliferating groups represented by the above formula (15) in one molecule, the base proliferating reaction occurs efficiently. This tends to cause the crosslinking reaction of the curable compound (B) such as an epoxy compound to easily proceed. Therefore, the base proliferating agent (C) is preferably a monomer or an oligomer which has at least two (meth)acrylate groups. A polyfunctional (meth)acrylate monomer described on pp. 20-42 and pp. 60-68 of "Hikarikouka Gijutsu Handbook Zairyou-hen" or a (meth)acrylate oligomer described on pp. 84-118 of the same handbook can be used as the above compound.

Specific examples of the polyfunctional (meth)acrylate monomer or the (meth)acrylate oligomer include ethylene di(meth)acrylate, 1,4-butanediol di(meth)acrylate, 1,6-hexanediol di(meth)acrylate, neopentyl glycol di(meth)acrylate, glycerol di(meth)acrylate, diethylene glycol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, cyclohexane dimethanol di(meth)acrylate, alkoxylated hexanediol di(meth)acrylate, alkoxylated cyclohexane dimethanoldiacrylate, propoxylated neopentyl glycol di(meth)acrylate, di(meth)acryloylated isocyanurate, EO-modified bisphenol A di(meth)acrylate, trimethylolpropane tri(meth)acrylate, ethoxylated trimethylolpropane tri(meth)acrylate, propoxylated trimethylolpropane tri(meth)acrylate, pentaerythritol tri(meth)acrylate, caprolactone-modified tirmethylolpropane tri(meth)acrylate, EO-modified trimethylolpropane tri(meth)acrylate, tris(acryloyloxyethyl) isocyanurate, pentaerythritol tetra(meth)acrylate, pentaerythritol ethoxytetraacrylate, dipentaerythritol penta(meth)acrylate, dipentaerythritol hexa(meth)acrylate, caprolactone-modified dipentaerythritol hexa(meth)acrylate, polyester acrylate oligomer, epoxy acrylate, urethane (meth)acrylate, and analogues of these compounds.

A novolac-type compound, or a polyfunctional (meth)acrylate described in JP 11-193317 A and JP 2005-76005 A can be used as the above polyfunctional (meth)acrylate monomer or the (meth)acrylate oligomer. Each of these may be used alone, in combination of two or more kinds thereof.

A compound having at least two unsaturated groups represented by the above formula (16) may be used in order to increase the number of base proliferating groups represented by the above formula (15) in one molecule of the base proliferating agent.

In order to produce such a compound having at least two unsaturated groups represented by the above formula (16), for example, α-thioglycerol is added to a compound having an unsaturated group represented by the above formula (16) to cause a Michael addition reaction between them. This converts the unsaturated group into a diol-substituted group which is represented by the following formula (17). Next, the hydroxyl group is esterified or urethanized. This reaction can cause, for example, one unsaturated group to be converted into two or four unsaturated groups as described later.

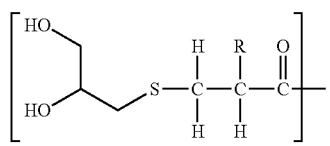

(17)

R in the above formula (17) represents hydrogen or a methyl group.

When a compound having at least two unsaturated groups represented by the above formula (16) is to be reacted with α-thioglycerol, the amount of α-thioglycerol to be added is preferably within the range of 0.5 to 1.5 mole per 1 mole of the above unsaturated group. When all the unsaturated groups are to be converted into a group having a diol structure, which is represented by the above formula (17), the amount of α-thioglycerol to be added is preferably 1.0 to 1.2 mole, and more preferably 1.0 mole per 1 mole of the above unsaturated group. A basic catalyst is preferably used to promote the reaction.

A tertiary amine is preferable as the above basic catalyst. Examples of the basic catalyst include triethylamine, tripropylamine, tributylamine, dimethylbenzylamine, N-methyldiethanolamine, pyridine, picoline, and lutidine. A basic ion-exchange resin can be used as the above basic catalyst.

A reaction temperature in the above reaction for producing a compound having at least two unsaturated groups represented by the above formula (16) is preferably within the range of room temperature (23° C.) to 150° C., and more preferably within the range of the room temperature to 100° C. A reaction time can be appropriately changed in accordance with the reaction temperature. The reaction time is preferably within the range of 10 minutes to 60 hours, and more preferably within the range of 1 hour to 50 hours.

As a method of introducing a (meth)acrylate group, which is an unsaturated group, to the hydroxyl group of a polyol compound having a group represented by the above formula (17), an esterification method or a urethanization method can be used.

In the esterification method, a (meth)acrylate group may be introduced using (meth)acryloyl chloride or (meth)acrylic anhydride in accordance with a common procedure. The esterification method is preferably a method of causing a dehydration-condensation reaction with a (meth)acrylic acid in the presence of an acid catalyst, as shown by the following scheme (X3). Water generated in this reaction can be removed by azeotroping or the like.

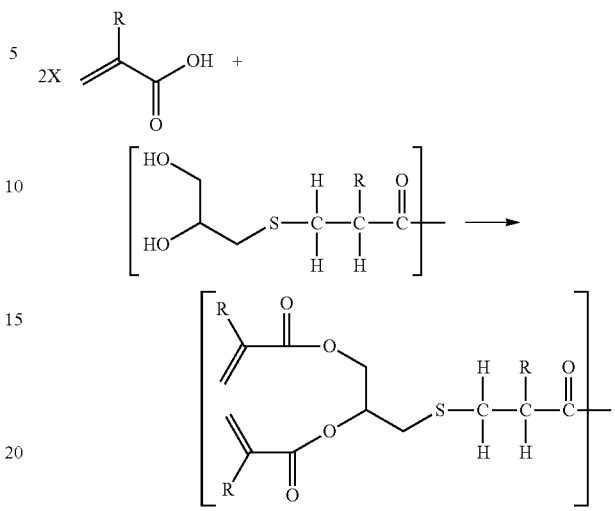

R in the above scheme (X3) represents hydrogen or a methyl group.

In the urethanization method, an addition reaction with a (meth)acrylate derivative having an isocyanato group is used. Examples of the isocyanato compound used for this reaction include 2-isocyanate ethylacrylate (Karenz AOI produced by Showa Denko K.K.), 2-isocyanate ethyl methacrylate (Karenz MOI produced by Showa Denko K.K.), and 1,3-diacryloyloxy-2-isocyanate-2-methylpropane (Karenz BEI produced by Showa Denko K.K.).

The amount of the isocyanato compound to be used is preferably 0.5 to 2.0 mole, more preferably 0.5 to 1.5 mole, and still more preferably 1.0 to 1.2 mole per 1 mole of the hydroxyl group of the polyol compound having a group represented by the above formula (17).

In order to promote the addition reaction in a solvent with the above polyol compound at least partially dissolved therein, the basic catalyst used in the above addition reaction for diol substitution can be used. A catalyst such as di-n-butyltin dilaurate may be further used. Further, a polymerization inhibitor is preferably used so as to suppress a polymerization reaction. A reaction temperature is preferably within the range of the room temperature to 100° C., and more preferably within the range of 40° C. to 80° C. A reaction time can be appropriately changed in accordance with the reaction temperature. The reaction time is preferably within the range of 30 minutes to 20 hours, and more preferably within the range of 1 hour to 15 hours.

When an excess of the isocyanato compound is to be removed after completion of the reaction, N,N-dimethylethanolamine, for example, is added to the reaction solution to react with the excess of the isocyanato compound. Then, washing with an acid aqueous solution, or adsorption with an acid ion-exchange resin may be performed.

In the above addition reaction, the isocyanato group reacts with the hydroxyl group in a group represented by the above formula (17) to form an urethane bond. Accordingly, use of 2-isocyanato ethyl(meth)acrylate leads to introduction of one unsaturated group to one hydroxyl group, as shown in the following scheme (X4).

scheme (X4)

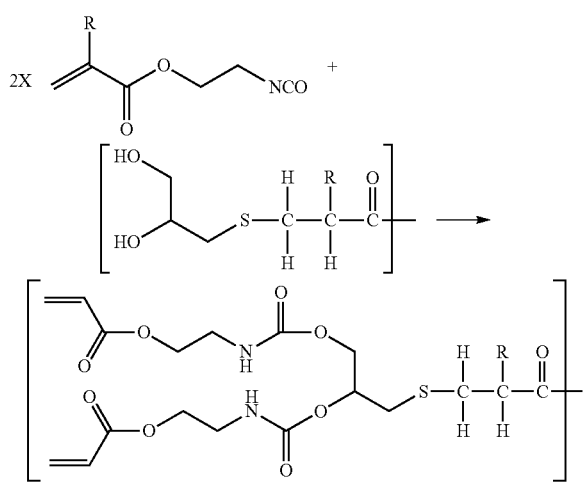

R in the above scheme (X4) represents hydrogen or a methyl group.

Use of 1,3-di(meth)acryloyloxy-2-isocyanate-2-methylpropane leads to introduction of two unsaturated groups to one hydroxyl group, as shown in the following scheme (X5). In the scheme (X4), the structure having two branches similar to the structure of the above scheme (X3) can be produced. In the following scheme (X5), a structure having four branches can be obtained in one step because two acrylate groups are introduced into one hydroxyl group.

scheme (X5)

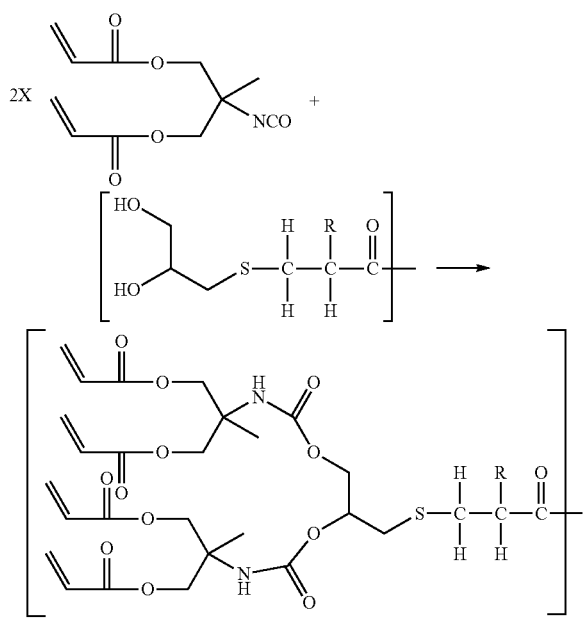

R in the above scheme (X5) represents hydrogen or a methyl group.

As shown in the above schemes (X3) to (X5), a plurality of unsaturated groups represented by the above formula (16) are regenerated by esterifying or urethanizing the hydroxyl group in a group represented by the formula (17). A further addition reaction between the regenerated unsaturated groups and α-thioglycerol makes it possible to introduce even more hydroxyl groups. This means that a dendrimer is produced in which repetition of a Michael addition reaction between the unsaturated group and α-thioglycerol and a reaction introducing a (meth)acryloyl group to the hydroxyl group after the Michael addition reaction corresponds to the number of generations. The respective reactions make it possible to produce a dendrimer in which a (meth)acryloyl group is introduced into an end of a molecular chain. Therefore, it is possible to produce a compound having a plurality of unsaturated groups represented by the above formula (16) at an end of a molecular chain.

An addition reaction between the compound having an unsaturated group represented by the formula (16) and 9-fluorenylmethyl-N-(2-mercaptoethyl)carbamate is preferably used to convert the unsaturated group represented by the above formula (16) into the base proliferating group represented by the above formula (15).

9-fluorenylmethyl-N-(2-mercaptoethyl)carbamate having a mercapto group easily reacts with the compound having an unsaturated group represented by the above formula (16) to cause a Michael addition reaction. Hence, it is possible to easily produce a compound having a base proliferating group represented by the above formula (15).

When a compound having at least two unsaturated groups represented by the above formula (16) in one molecule is to be used for a reaction between a compound having an unsaturated group represented by the above formula (16) and 9-fluorenylmethyl-N-(2-mercaptoethyl)carbamate, all the unsaturated groups may be reacted with a mercapto compound, or a part of the unsaturated groups may be reacted with the mercapto compound. In a compound having a base proliferating group represented by the above formula (15) and an unsaturated group represented by the above formula (16) in one molecule, an addition reaction occurs between an amino group generated from the base proliferating group and the unsaturated group. Accordingly, the compound itself, which has the base proliferating group and the unsaturated group in one molecule, exhibits a curing reaction.

The usage ratio of the unsaturated group represented by the above formula (11) and 9-fluorenylmethyl-N-(2-mercaptoethyl)carbamate can be appropriately changed in accordance with the conversion rate of the unsaturated group. Use of 1.0 to 1.5 mole of 9-fluorenylmethyl-N-(2-mercaptoethyl)carbamate is preferable per 1 mole of the unsaturated group represented by the above formula (11). In order to efficiently proceed with this reaction, a basic catalyst is preferably used.

The basic catalyst for converting the unsaturated group into the base proliferating group is preferably a tertiary amine. Examples of the basic catalyst include triethylamine, tripropylamine, tributylamine, dimethylbenzylamine, N,N-diisopropylmethylamine, N,N-dicyclohexylmethylamine, N-methyldiethanolamine, pyridine, picoline, lutidine, and basic ion-exchange resins. A reaction temperature in the reaction of converting the unsaturated group into the base proliferating group is preferably within the range of the room temperature to 150° C., and more preferably within the range of the room temperature to 100° C. A reaction time can be appropriately changed in accordance with the reaction temperature. The reaction time is preferably within the range of 10 minutes to 60 hours, and more preferably within the range of 1 hour to 50 hours.

The blending ratio of the base proliferating agent (C) is preferably within the range of 20 to 100 parts by weight per 100 parts by weight of the curable compound (B). When the amount of the base proliferating agent (C) is too small, it may lead to insufficient generation of a base in the base proliferating reaction. On the other hand, when the amount of the base proliferating agent (C) is too large, it may lead to precipitation of the base proliferating agent.

(Photo-Sensitizer (D))

The photocurable composition according to the present invention comprises the above photobase generator (A), and thus can generate a satisfactory amount of a base when irradiated even with a small quantity of light for a short time without a photo-sensitizer, though the photobase generator (A) may be used in combination with the photo-sensitizer (D). Combination use of the photobase generator (A) and the photo-sensitizer (D) can further increase photodegradability.

Examples of the above photo-sensitizer (D) include triplet-excited-energy-transfer photo-sensitizers and electron-transfer photo-sensitizers. Specific examples of the photo-sensitizer (D) include acetophenones, benzophenone, Michler's ketone, benzyl, benzoin, benzoin ether, benzil dimethyl ketal, benzoyl benzoate, α-acyloxime ester, tetramethylthiuram monosulfide, thioxanthone, aliphatic amine, amine having an aromatic group, compound having nitrogen as a part of the ring such as piperidine, allylthiourea, O-tolylthiourea, sodium diethyl dithiophosphate, soluble salt of an aromatic sulfinic acid, N,N-disubstituted-p-aminobenzonitrile compound, tri-n-butylphosphine, N-nitrosohydroxylamine derivative, oxazolidine compound, tetrahydro-1,3-oxazine compound, condensate of diamine and formaldehyde or acetaldehyde, anthracene, derivative of anthracene, xanthine, N-phenylglycine, cyanine dye porphyrin, and derivative of cyanine dye porphyrin. Examples of the cyanine dye porphyrin include phthalocyanine, naphthocyanine, and thiocyanine.

Among these, a thioxanthone sensitizer is preferable which can lead to very high photodegradability. Note that the thioxanthone sensitizer is thioxanthone or a compound produced by introducing a substituent group into thioxanthone. Examples of the compound produced by introducing a substituent group into thioxanthone include 2,4-diethylthioxanthone, 2-chlorothioxanthone, 2,4-diisopropylthioxanthone, 2,4-dimethylthioxanthone, and isopropylthioxanthone.

The blending amount of the photo-sensitizer (D) is preferably within the range of 1 to 100 parts by weight, and more preferably within the range of 1 to 50 parts by weight per 100 parts by weight of the photobase generator (A). When the amount of the photo-sensitizer (D) is too small, it may not sufficiently increase sensitivity of the composition. When the amount of the photo-sensitizer (D) is too large, it may increase the amount of residue resulting from the photo-sensitizer (D), which may make it difficult to produce a desired cured product.

(Other Ingredients which May be Added)

The photocurable composition according to the present invention may further comprise an appropriate solvent. The photocurable composition, when comprising a solvent, can increase coatability.

The above solvent is not particularly limited. Specific examples of the solvent include aromatic hydrocarbon compounds, saturated or unsaturated hydrocarbon compounds, ethers, ketones, and esters. Each of these solvents may be used alone or in combination of two or more kinds thereof.

Examples of the aromatic hydrocarbon compound include benzene, xylene, toluene, ethylbenzene, styrene, trimethylbenzene, and diethylbenzene. Examples of the saturated or unsaturated hydrocarbon compound include cyclohexane, cyclohexene, dipentene, n-pentane, isopentane, n-hexane, isohexane, n-heptane, isoheptane, n-octane, isooctane, n-nonane, isononane, n-decane, isodecane, tetrahydro naphthalene, and squalane. Examples of the ethers include diethyl ether, di-n-propyl ether, di-isopropyl ether, dibutyl ether, ethyl propyl ether, diphenyl ether, diethylene glycol dimethyl ether, diethylene glycol diethyl ether, diethylene glycol dibutyl ether, diethylene glycol methyl ethyl ether, dipropylene glycol dimethyl ether, dipropylene glycol diethyl ether, dipropylene glycol dibutyl ether, dipropylene glycol methyl ethyl ether, ethylene glycol dimethyl ether, ethylene glycol diethyl ether, ethylene glycol dipropyl ether, ethylene glycol methyl ethyl ether, tetrahydrofuran, 1,4-dioxane, propylene glycol monomethyl ether acetate, ethylene glycol monoethyl ether acetate, dipropylene glycol methyl ether acetate, diethylene glycol monoethyl ether acetate, ethylcyclohexane, methylcyclohexane, p-menthane, o-menthane, m-menthane, dipropylether, and dibutylether. Examples of the ketones include acetone, methyl ethyl ketone, methyl isobutyl ketone, diethyl ketone, dipropyl ketone, methyl amyl ketone, cyclopentanone, cyclohexanone, and cycloheptanone. Examples of the esters include ethyl acetate, methyl acetate, butyl acetate, propyl acetate, cyclohexyl acetate, methyl cellosolve acetate, ethyl cellosolve acetate, butyl cellosolve acetate, ethyl lactate, propyl lactate, butyl lactate, isoamyl lactate, and butyl stearate.

The photocurable composition according to the present invention may further comprise other additives according to need. Examples of the additive include filler, pigment, dye, leveling agent, antifoam agent, antistatic agent, ultraviolet absorber, pH adjuster, dispersing agent, dispersing auxiliary agent, surface modifier, plasticizer, plasticization accelerator, and anti-sagging agent.

The method of producing the photocurable composition according to the present invention is not particularly limited. Examples of the method of producing the photocurable composition include a method of melt-blending the photobase generator (A), the curable compound (B), and other ingredients to be added according to need, and a method of dissolving respective ingredients in a solvent.

The light source to irradiate the photocurable composition according to the present invention is not particularly limited. Ultra-high pressure mercury-vapor lamps, deep UV lamps, high pressure mercury-vapor lamps, low pressure mercury-vapor lamps, metal halide lamps, LED light sources, and excimer lasers can be used as the light source. An appropriate light source is selected from those light sources according to the photosensitive wavelength of the ingredients comprised in the photocurable composition, such as the photobase generator (A) or the photo-sensitizer (D).

The radiation energy of the light can be appropriately changed according to the kind of the ingredients comprised in the photocurable composition, such as the photobase generator (A) or the photo-sensitizer (D).

The radiation energy of the light is generally within the range of 10 to 2000 mJ/cm$^2$. Light radiation energy of smaller than 10 mJ/cm$^2$ may not sufficiently cure the photocurable composition. Light radiation energy of larger than 2000 mJ/cm$^2$ may require long irradiation time, and thus the infrared rays emitted from the light source may deteriorate the cured product with the heat.

The photocurable composition may be cured after being coated on a heat resistant substrate. In this case, the photocurable composition can be heated by a heating device so that curing of the composition by an amine generated by light irradiation is accelerated. Examples of the heating device include ovens, heat guns, IR heaters, far-infrared ray heaters, nichrome wire heaters, dielectric heating devices, and induction heaters.

The photocurable composition according to the present invention comprises the photobase generator (A) generating a base in a very high quantum yield, and thus can make the light radiation energy much smaller than that in the case where the photocurable composition comprises a conventional photobase generator (A), for example, the light radiation energy can be reduced to about 1/10 of the case where the photocurable composition comprises a conventional photobase generator (A).

The photocurable composition according to the present invention can be suitably used as products such as adhesives, pressure-sensitive adhesives, paints, coating agents, sealants, resists, sealing agents, and inks. Among these, the photocurable composition can be particularly suitably used as an adhesive or a coating agent.

The present invention will be described in more detail based on Examples. The present invention is not limited to these Examples.

Synthesis Example 1

Synthesis of Photobase Generator (A1)

20 g of ketoprophen (product of Tokyo Chemical Industry Co., Ltd.) as the carboxylic acid (a1) represented by the above formula (1) and 4.57 g of 1,6-hexamethylenediamine (product of Wako Pure Chemical Industries, Ltd.) as the basic compound (a2) were added to 50 g of methanol, and the mixture was stirred at room temperature for 24 hours for reaction. After removal of ethanol with an evaporator, a resulting crude product was recrystallized with ethanol/hexane to give a photobase generator (A1).

Synthesis Example 2

Synthesis of Photobase Generator (A2)

A photobase generator (A2) was obtained by using 20 g of ketoprophen (product of Tokyo Chemical Industry Co., Ltd.) as the carboxylic acid (a1) represented by the above formula (1) and 8.2 g of 1,3-di-4-piperidyl propane (product of Tokyo Chemical Industry Co., Ltd.) as the basic compound (a2) according to the same procedures as those for the synthesis of the photobase generator (A1).

Synthesis Example 3

Synthesis of Photobase Generator (A3)

A photobase generator (A3) was obtained by using 20 g of ketoprophen (product of Tokyo Chemical Industry Co., Ltd.) as the carboxylic acid (a1) represented by the above formula (1) and 7.8 g of cyclohexylamine (product of Wako Pure Chemical Industries, Ltd.) as the basic compound (a2) according to the same procedures as those for the synthesis of the photobase generator (A1).

Synthesis Example 4

Synthesis of Carbamoyloxyimino Compound 0.02 mol of hexamethylene diisocyanate and 0.04 mol of acetophenone oxim were dissolved in 50 ml of tetrahydrofuran (THF) and then stirred at 60° C. for five hours under nitrogen atmosphere. Thereafter, the resulting mixture was allowed to stand at room temperature for five hours, followed by filtration to collect a resulting white crystal. The white crystal was dried in a vacuum drying oven to evaporate the THF, thereby giving a carbamoyloxyimino compound as a photobase generator other than the photobase generator (A).

Synthesis Example 5

Synthesis of Compound Having Isocyanate Groups (B2)

To 100 parts by weight of polyether triol (weight-average molecular weight of 4,000, product name: ADEKA POLYETHER T-4000, product of Adeka Corporation) produced from trimethylolpropane and propyleneoxide and 100 parts by weight of polypropylene oxide (weight-average molecular weight of 6,000) was added diphenyl methane-4,4'-diisocyanate (product name: Millionate MT, product of Japan Polyurethane Industry Co., Ltd.) at an NCO/OH equivalent ratio of 1.9. The resulting mixture was reacted at 80° C. for five hours to give compound having isocyanate groups (B2) (urethane prepolymer) as a curable compound having at least two isocyanate groups.

Synthesis Example 6

Synthesis of Compound Having Alkoxysilyl Groups (B4)

50 g of N-butyl acrylate (product of Nippon Shokubai Co., Ltd.), 45 g of ethyl acrylate (product of Nippon Shokubai Co., Ltd.), 5 g of 3-methacryloyloxy propyltrimethoxysilane (KBM-503, product of Shin-Etsu Chemical Industry Co., Ltd.), 1 g of lauryl mercaptan (product of Wako Pure Chemical Industries Ltd.), and 100 g of toluene were placed in a 1 L-separable flask equipped with a stirrer, a condenser, a thermometer, and a nitrogen gas-introducing inlet, and mixed to give a monomer mixture solution. The obtained monomer mixture solution was bubbled with nitrogen gas for 20 minutes to remove the dissolved oxygen. Thereafter, the atmosphere of the system in the separable flask was replaced with nitrogen gas, and the temperature inside the separable flask was raised to a reflux temperature under stirring.

Upon reaching reflux, a solution prepared by diluting 0.05 g of 1,1-di(t-hexylperoxy)-3,3,5-trimethylcyclohexane as a polymerization initiator with 1 g of toluene was added to a polymerization system. An hour later, a solution prepared by diluting 0.1 g of 1,1-di(t-hexylperoxy)-3,3,5-trimethylcyclohexane with 1 g of toluene was further added. Moreover, two hours later after initiation of the polymerization, a solution prepared by diluting 0.5 g of 1,1-di(t-hexylperoxy)-3,3,5-trimethylcyclohexane with 1 g of toluene was further added. Four hours later after the first addition of the polymerization initiator, the reaction solution was cooled. By adding 50 g of ethanol, a toluene/ethanol solution of compound having alkoxysilyl groups (B4) (number-average molecular weight of about 9000 as converted to polystyrene) was prepared as a curable compound having at least two alkoxysilyl groups.

Synthesis Example 7

Synthesis of Photobase Generator (A4)

A photobase generator (A4) was obtained by using 20 g of ketoprophen (product of Tokyo Chemical Industry Co., Ltd.) as the carboxylic acid (a1) represented by the above formula (1) and 7.96 g of triethylamine (product of Wako Pure Chemical Industries Co., Ltd.) as the basic compound (a2) according to the same procedures as those for the synthesis of the photobase generator (A1).

Synthesis Example 8

Synthesis of Photobase Generator (A5)

A photobase generator (A5) was obtained by using 20 g of ketoprophen (product of Tokyo Chemical Industry Co., Ltd.) as the carboxylic acid (a1) represented by the above formula (1) and 8.8 g of 1,4-diazabicyclo[2,2,2]octane (product of Tokyo Chemical Industry Co., Ltd.) as the basic compound (a2) according to the same procedures as those for the synthesis of the photobase generator (A1).

Synthesis Example 9

Synthesis of Photobase Generator (A6)

A photobase generator (A6) was obtained by using 20 g of ketoprophen (product of Tokyo Chemical Industry Co., Ltd.) as the carboxylic acid (a1) represented by the above formula (1) and 12 g of 1,8-diazabicyclo[5,4,0]-7-undecane (DBU) (product of Tokyo Chemical Industry Co., Ltd.) as the basic compound (a2) according to the same procedures as those for the synthesis of the photobase generator (A1).

Synthesis Example 10

Synthesis of Photobase Generator (A7)

A photobase generator (A7) was obtained by using 20 g of ketoprophen (product of Tokyo Chemical Industry Co., Ltd.) as the carboxylic acid (a1) represented by the above formula (1) and 9 g of Jeffermine D-230 (product of Huntsman) as the basic compound (a2) according to the same procedures as those for the synthesis of the photobase generator (A1).

Synthesis Example 11

Synthesis of Photobase Generator (A8)

A photobase generator (A8) was obtained by using 20 g of ketoprophen (product of Tokyo Chemical Industry Co., Ltd.) as the carboxylic acid (a1) represented by the above formula (1) and 14 g of 1,3-di-4-piperidyl propane (product of Tokyo Chemical Industry Co., Ltd.) as the basic compound (a2) according to the same procedures as those for the synthesis of the photobase generator (A1).

Synthesis Example 12

Synthesis of poly(glycidyl methacrylate/n-butyl acrylate) Copolymer (B8)

50 g of N-butyl acrylate (product of Nippon Shokubai Co., Ltd.), 50 g of glycidyl methacrylate (product of Mitsubishi Gas Chemical Company Inc.), 3 g of lauryl mercaptan (product of Wako Pure Chemical Industries Ltd.), and 100 g of toluene were placed in a 1 L-separable flask equipped with a stirrer, a condenser, a thermometer, and a nitrogen gas-introducing inlet, and mixed to give a monomer mixture solution. The obtained monomer mixture solution was bubbled with nitrogen gas for 20 minutes to remove the dissolved oxygen. Thereafter, the system in the separable flask was replaced with nitrogen gas, and the temperature inside the separable flask was raised to a reflux temperature under stirring. Next, polymerization was performed in the same manner as that in Synthesis Example 6 to provide a toluene/ethanol solution of a poly(glycidyl methacrylate/n-butyl acrylate) copolymer (B8) (number-average molecular weight of 3,000 as converted to polystyrene, epoxide equivalent of 284) as a curable compound having at least two glycidyl groups.

Synthesis Example 13

Synthesis of poly(glycidyl methacrylate/n-butyl acrylate) Copolymer (B9)

A toluene/ethanol solution of a poly(glycidyl methacrylate/n-butyl acrylate) copolymer (B9) (number-average molecular weight of 120,000 as converted to polystyrene, epoxide equivalent of 8,000) as a curable compound having at least two glycidyl groups was provided in the same manner as that in Synthesis Example 12, except that the blending amount of n-butyl acrylate (product of Nippon Shokubai Co., Ltd.) was changed to 98.22 g, the blending amount of the glycidyl methacrylate (product of Mitsubishi Gas Chemical Company Inc.) was changed to 1.78 g, and the blending amount of the lauryl mercaptan (product of Wako Pure Chemical Industries Ltd.) was changed to 1.7 g.

Synthesis Example 14

Synthesis of poly(glycidyl methacrylate/n-butyl acrylate) Copolymer (B10)

A toluene/ethanol solution of a poly(glycidyl methacrylate/n-butyl acrylate) copolymer (B10) (number-average molecular weight of 135,000 as converted to polystyrene, epoxide equivalent of 45,000) as a curable compound having at least two glycidyl groups was provided in the same manner as that in Synthesis Example 12, except that the blending amount of n-butyl acrylate (product of Nippon Shokubai Co., Ltd.) was changed to 99.68 g, the blending amount of the glycidyl methacrylate (product of Mitsubishi Gas Chemical Company Inc.) was changed to 0.32 g, and the blending amount of the lauryl mercaptan (product of Wako Pure Chemical Industries Ltd.) was changed to 0.1 g.

Synthesis Example 15

Synthesis of poly(glycidyl methacrylate) (B11)

A toluene/ethanol solution of a poly(glycidyl methacrylate) (B11) (number-average molecular weight of 3,000 as converted to polystyrene) as a curable compound having at least two glycidyl groups was provided in the same manner as that in Synthesis Example 12, except that the n-butyl acrylate (product of Nippon Shokubai Co., Ltd.) was not used, and the blending amount of the glycidyl methacrylate (product of Mitsubishi Gas Chemical Company Inc.) was changed to 100 g.

Synthesis Example 16

Synthesis of poly(glycidyl methacrylate/n-butyl acrylate) Copolymer (B12)

A toluene/ethanol solution of a poly(glycidyl methacrylate/n-butyl acrylate) copolymer (B12) (number-average molecular weight of 200,000 as converted to polystyrene, epoxide equivalent of 66,000) as a curable compound having at least two glycidyl groups was provided in the same manner as that in Synthesis Example 12, except that the blending amount of n-butyl acrylate (product of Nippon Shokubai Co., Ltd.) was changed to 99.93 g, the blending amount of the glycidyl methacrylate (product of Mitsubishi Gas Chemical Company Inc.) was changed to 0.07 g, and the blending amount of the lauryl mercaptan (product of Wako Pure Chemical Industries Ltd.) was changed to 0.03 g.

Synthesis Example 17

Synthesis of HDI-fluorenemethanol Adduct (C2)

40 g of toluene which had been dried overnight with a molecular sieve 3A was placed in a reactor vessel equipped with a stirrer, a condenser, a thermometer, and a nitrogen gas-introducing inlet. Then, 10 g of 9-fluorenemethanol (product of Tokyo Chemical Industry Co., Ltd.) was dissolved in the toluene, and further 4.28 g of 1,6-hexamethylene diisocyanate (product of Tokyo Chemical Industry Co., Ltd.) was dropwise added to the solution, followed by stirring at 80° C. for five hours under nitrogen atmosphere. The toluene was then removed with an evaporator to give an HDI-fluorenemethanol adduct (C2) as the base proliferating agent.

(Evaluation Method for Functional Group Equivalent)

Functional group equivalents of the curable compounds (B) used in Examples and Comparative Examples were obtained according to the evaluation method described below. Tables 1 to 3 show the results. In the case of a plurality of the curable compounds (B), an average value of the functional group equivalents was shown.

When the functional group was an epoxy group, the functional group equivalent of the curable compound (B) was provided in accordance with the method of JIS K 7236.

When the functional group was a (meth)acryloyl group, the functional group equivalent of the curable compound (B) was obtained by dividing the atomic weight of iodine (126.9) by the iodine value (mgI/g) obtained in accordance with JIS K 0070 and multiplying the result by 1000.

When the functional group was an isocyanate group, the functional group equivalent of the curable compound (B) was obtained by dividing the chemical formula weight of isocyanate group (42.02) by the content ratio of the isocyanate group obtained in accordance with JIS K 7301.

When the functional group was an acid anhydride group, esterification reaction was first promoted by ethanol and, at the same time, an acid was generated. Thereafter, the acid value (mg KOH/g) was obtained in accordance with JIS K 0070. The functional group equivalent of the curable compound (B) was obtained by dividing the formula weight of KOH, 56.11, by the above-obtained acid value, and then multiplying the result by 1000.

When the functional group was an alkoxysilyl group, the functional group equivalent of the curable compound (B) was obtained by dividing the atomic weight of silicon atom, 28, by the content (% by weight) of the silicon in the curable compound (B), the content being measured by elemental analysis, and then multiplying the result by 100.

When the functional groups were not consumed during the synthesis in Synthesis Examples for providing the curable compounds (B), the functional group equivalent of the curable compound (B) was obtained according to the following formula based on the charged amount ratio.

Functional group equivalent=(total amount of materials charged)/Σ[(charged amount of material $n$ having functional group)×(the number of functional groups in material $n$ having functional group)/(molecular weight of material $n$ having functional group)]

The phrases (charged amount of material n having functional group), (the number of functional groups in material n having functional group), and (molecular weight of material n having functional group) mentioned earlier respectively refer to a charged amount, the number of functional groups, and a molecular weight of the $n^{th}$ material of n kinds of the used materials which have a functional group. Further, the expression:

Σ[(charged amount of material $n$ having functional group)×(the number of functional groups in material $n$ having functional group)/(molecular weight of material $n$ having functional group)]

leads to the sum of values resulting from calculation of

[(charged amount of material $n$ having functional group)×(the number of functional groups in material $n$ having functional group)/(molecular weight of material $n$ having functional group)]

for the $1^{st}$ to $n^{th}$ materials each having the functional groups.

On the other hand, when the number of the materials having functional group is one, and further the number of the functional group is one, the aforementioned functional group equivalent can be expressed by the formula below, which is modified from the foregoing formula.

Functional group equivalent=100×(number average molecular weight of the materials having functional group)/(charged amount of materials having functional group (% by weight))

Example 1

A photocurable composition was provided by diluting 60 parts by weight of the photobase generator (A1) and 100 parts by weight of Aronix M8030 (product of Toagosei Co., Ltd.) as a (meth)acrylic resin (B1) which was a curable compound having at least two (meth)acryloyl groups, with 40 parts by weight of ethanol as a diluent.

Example 2

A photocurable composition was provided by diluting 15 parts by weight of the photobase generator (A1) and 100 parts by weight of an urethane prepolymer as the compound having isocyanate groups (B2) which was a curable compound having at least two isocyanate groups, with 50 parts by weight of toluene.

Example 3

A photocurable composition was provided by diluting 130 parts by weight of the photobase generator (A1) and 100 parts by weight of RIKACID MTA 15 (product of New Japan Chemical Co., Ltd.) as compound having acid anhydride groups (B3) which was a curable compound having at least two acid anhydride groups, with 100 parts by weight of N-methylpyrrolidone as a diluent.

Example 4

A photocurable composition was provided by mixing 30 parts by weight of the photobase generator (A1) and a toluene/ethanol solution containing 100 parts by weight of resin having alkoxysilyl groups (number-average molecular weight of 4,000 as converted to polystyrene) as the compound having alkoxysilyl groups (B4) which was a curable compound having at least two alkoxysilyl groups.

Example 5

A photocurable composition was provided by diluting 150 parts by weight of the photobase generator (A1) and 100 parts by weight of a bisphenol A epoxy resin, Epicoat 828 (product of Japan Epoxy Resins Inc.) as a epoxy resin (B5) which was a curable compound having at least two epoxy groups, with 100 parts by weight of ethanol as a diluent.

Example 6

A photocurable composition was provided by diluting 150 parts by weight of the photobase generator (A1) and 100 parts by weight of a novolac epoxy resin, Epicoat 152 (product of Japan Epoxy Resins Inc.) as an epoxy resin (B6) which was a curable compound having at least two epoxy groups, with 100 parts by weight of ethanol as a diluent.

Example 7

A photocurable composition was provided by diluting 150 parts by weight of the photobase generator (A1) and 100 parts by weight of a glycidyl amine epoxy resin, Epicoat 1031S (product of Japan Epoxy Resins Inc.) as an epoxy resin (B7) which was a curable compound having at least two epoxy groups, with 50 parts by weight of ethanol and 50 parts by weight of toluene as diluent.

Example 8

A photocurable composition was provided in the same manner as that in Example 5, except that the photobase generator (A2) was used in place of the photobase generator (A1).

Example 9

A photocurable composition was provided in the same manner as that in Example 5, except that 20 parts by weight of the photobase generator (A3) was used in place of 150 parts by weight of the photobase generator (A1).

Example 10

A photocurable composition was provided by mixing 75 parts by weight of the photobase generator (A1), 100 parts by weight of a bisphenol A epoxy resin, Epicoat 828 (product of Japan Epoxy Resins Inc.) as an epoxy resin (B5) which was a curable compound having at least two epoxy groups, and 75 parts by weight of the compound Flu4 (C1) represented by the above formula (14) as a base proliferating agent.

Example 11

A photocurable composition was provided by mixing 150 parts by weight of the photobase generator (A1), 100 parts by weight of a bisphenol A epoxy resin, Epicoat 828 (product of Japan Epoxy Resins Inc.) as an epoxy resin (B5) which was a curable compound having at least two epoxy groups, and 5 parts by weight of diethylthioxanthone (D1) as a photo-sensitizer.

Comparative Example 1

A photocurable composition was provided in the same manner as that in Example 5, except that the carbamoyloxy-imino compound given in Synthesis Example 4 was used in place of the photobase generator (A1).

Examples 12 to 25

Photocurable compositions were provided in the same manner as in Example 1, except that the kind and the blending amount of the photobase generator (A) and the curable compound (B) were changed to the kinds and the amounts shown in Table 2 below.

Examples 26 to 30

Photocurable compositions were provided in the same manner as in Example 1, except that the kind and the blending amount of the photobase generator (A) and the curable compound (B) were changed to the kinds and the amounts shown in Table 3 below, and also the base proliferating agents (C) shown in Table 3 were further mixed in the amounts shown in Table 3.

Examples 31 to 37

Photocurable compositions were provided in the same manner as in Example 1, except that the kind and the blending amount of the photobase generator (A) and the curable compound (B) were changed to the kinds and the amounts shown in Table 3 below, and also the photo-sensitizers (D) shown in Table 3 were further mixed in the amounts shown in Table 3.

Comparative Example 2

A photocurable composition was provided in the same manner as in Example 1, except that 20 parts by weight of the photobase generator (A6) was used in place of 60 parts by weight of the photobase generator (A1), and 100 parts by weight of a polyimide precursor (RIKACOAT SN-20, product of New Japan Chemical Co., Ltd.) was used in place of 100 parts by weight of the (meth)acrylic resin (B1) as a curable compound.

(Evaluation)
(1) Tack-Free Radiation Energy

Each of the above-obtained photocurable compositions was applied on a glass plate in a manner that a resulting coating after drying had a thickness of about 50 μm, and then dried at 120° C. in an oven for 15 minutes to evaporate the diluent, thereby producing a photocurable composition coating. The coating was then irradiated with 365 nm light at a radiation intensity of 5 mW/cm$^2$ from above by using a high-pressure mercury-vapor lamp. Irradiation time from beginning of the light irradiation until when tack-free texture was achieved upon touching the coating with fingers was measured. The radiation energy was calculated based on the product of the illumination intensity and the irradiation time.

(2) Shear Adhesion Strength and Peel Adhesion Strength

According to JIS Z6850, a surface of an acrylic plate having a size of 150 mm in length×30 mm in width×2 mm in thickness was degreased with ethanol and dried, and then each photocurable composition was applied in a thickness of 50 μm on the surface of the acrylic plate. The photocurable composition on the acrylic plate was dried at 120° C. for 15 minutes in an oven to evaporate the diluent. Thereafter, another acrylic plate separately prepared was laminated on the photocurable composition to form a joint body. The joint surface of the joint body was irradiated with 365 nm light at an intensity of 10 mW/cm$^2$ for an irradiation time of 60 seconds within a wavelength range of 300 to 370 nm.

After the light irradiation, shear failure strength and peel failure strength of the joint body were measured with a tensile testing machine at a tensile rate of 10 mm/minute. The joint area was measured, and then the shear failure strength value was divided by the joint area value to give the shear adhesion strength. On the other hand, a size of the peeled portion in the width direction was measured, and then the peel failure strength value was divided by the size of the peeled portion in the width direction to give the peel adhesion strength.

Similar tests were performed by changing the acrylic plate to a glass plate (150 mm in length×30 mm in width×8 mm in thickness).

(3) Cross-Cut Tape Test

The photocurable composition obtained was applied on a surface of an acrylic plate, which had been degreased with ethanol and dried, in a manner that a resulting coating after drying had a thickness of about 50 μl. The photocurable composition on the acrylic plate was dried at 120° C. in an oven for 15 minutes to evaporate the diluent, thereby producing a photocurable composition coating. The photocurable composition coating was irradiated with 365 nm light for 60 seconds at a radiation intensity of 10 mW/cm$^2$ from above by using a high pressure mercury-vapor lamp. Thereafter, the resulting coating was subjected to a cross-cut tape test according to JIS K5400, and the evaluation points were recorded. A higher evaluation score indicates a better cohesion of the coating to the acrylic plate.

The following tables 1 to 3 show the results.

TABLE 1

| | | | | Ex. | | | | | |
|---|---|---|---|---|---|---|---|---|---|
| | | | | 1 | 2 | 3 | 4 | 5 | 6 |
| Blended Ingredient (parts by weight) | Photobase Generator (A) | Photobase Generator (A1) | | 60 | 15 | 130 | 30 | 150 | 150 |
| | | Photobase Generator (A2) | | | | | | | |
| | | Photobase Generator (A3) | | | | | | | |
| | | Photobase Generator (A4) | | | | | | | |
| | | Photobase Generator (A5) | | | | | | | |
| | | Photobase Generator (A6) | | | | | | | |
| | | Photobase Generator (A7) | | | | | | | |
| | | Photobase Generator (A8) | | | | | | | |
| | Another Photobase Generator | Carbamoyloxyimino Compound | | | | | | | |
| | Curable Compound (B) | (Meth)acrylic Resin (B1) | Aronix M8030 | 100 | | | | | |
| | | Compound Having Isocyanato Groups (B2) | Urethane Polymer | | 100 | | | | |
| | | Compound Having Acid Anhydride Groups (B3) | Rikacid MTA15 | | | 100 | | | |
| | | Compound Having Alkoxysilyl Groups (B4) | | | | | 100 | | |
| | | Epoxy Resin (B5) | Epicoat 828 | | | | | 100 | |
| | | Epoxy Resin (B6) | Epicoat 152 | | | | | | 100 |
| | | Epoxy Resin (B7) | Epicoat 1031S | | | | | | |
| | | Poly(Glycidyl Methacrylate/n-Butyl Acrylate) Copolymer (B8) | | | | | | | |
| | | Poly(Glycidyl Methacrylate/n-Butyl Acrylate) Copolymer (B9) | | | | | | | |
| | | Poly(Glycidyl Methacrylate/n-Butyl Acrylate) Copolymer (B10) | | | | | | | |
| | | Poly(Glycidyl Methacrylate) (B11) | | | | | | | |
| | | Poly(Glycidyl Methacrylate/n-Butyl Acrylate) Copolymer (B12) | | | | | | | |
| | | Isophorone Diisocyanate (B13) | | | | | | | |
| | Another Curable Compound | Polyimide Precursor | Rikacoat SN-20 | | | | | | |
| | Base Proliferating Agent (C) | Flu4 (C1) | | | | | | | |
| | | HDI-Fluorenemethanol Adduct (C2) | | | | | | | |
| | Photo-sensitizer (D) | Diethylthioxanthone (D1) | | | | | | | |
| | | 9,10-Dibutoxyanthracene (D2) | | | | | | | |
| | | Benzophenone (D3) | | | | | | | |
| Evaluation | Basic Functional Group of Basic Compound (a2)/ Curable Functional Group of Curable Compound (B) | | | 0.58 | 1.92 | 1.01 | 3.65 | 0.91 | 0.85 |
| | Functional Group Equivalent of Curable Compound (B) | | | 300 | 4000 | 242 | 3800 | 190 | 178 |
| | Tack-Free Radiation Energy | | mJ/cm$^2$ | 400 | 500 | 500 | 600 | 500 | 400 |
| | Shear Adhesion Strength | Acrylic Plate | kgf/cm$^2$ | 12 | 15 | 10 | 8 | 16 | 19 |
| | | Glass Plate | kgf/cm$^2$ | 15 | 16 | 9 | 6 | 14 | 16 |
| | Peel Adhesion Strength | Acrylic Plate | kgf/cm | 0.9 | 1.2 | 0.7 | 0.8 | 0.4 | 0.5 |
| | | Glass Plate | kgf/cm | 0.7 | 1.6 | 0.6 | 0.8 | 0.5 | 0.6 |
| | Cross-Cut Tape Test | | | 7 | 7 | 6 | 4 | 5 | 5 |

| | | | | Ex. | | | | | Comp. Ex. |
|---|---|---|---|---|---|---|---|---|---|
| | | | | 7 | 8 | 9 | 10 | 11 | 1 |
| Blended Ingredient (parts by weight) | Photobase Generator (A) | Photobase Generator (A1) | | 150 | | | 75 | 150 | |
| | | Photobase Generator (A2) | | | 150 | | | | |
| | | Photobase Generator (A3) | | | | 20 | | | |
| | | Photobase Generator (A4) | | | | | | | |
| | | Photobase Generator (A5) | | | | | | | |
| | | Photobase Generator (A6) | | | | | | | |
| | | Photobase Generator (A7) | | | | | | | |
| | | Photobase Generator (A8) | | | | | | | |

TABLE 1-continued

| | | | | | | | | |
|---|---|---|---|---|---|---|---|---|
| | Another Photobase Generator | Carbamoyloxyimino Compound | | | | | | 150 |
| Curable Compound (B) | (Meth)acrylic Resin (B1) | Aronix M8030 | | | | | | |
| | Compound Having Isocyanato Groups (B2) | Urethane Polymer | | | | | | |
| | Compound Having Acid Anhydride Groups (B3) | Rikacid MTA15 | | | | | | |
| | Compound Having Alkoxysilyl Groups (B4) | | | | | | | |
| | Epoxy Resin (B5) | Epicoat 828 | | 100 | 100 | 100 | 100 | 100 |
| | Epoxy Resin (B6) | Epicoat 152 | | | | | | |
| | Epoxy Resin (B7) | Epicoat 1031S | 100 | | | | | |
| | Poly(Glycidyl Methacrylate/n-Butyl Acrylate) Copolymer (B8) | | | | | | | |
| | Poly(Glycidyl Methacrylate/n-Butyl Acrylate) Copolymer (B9) | | | | | | | |
| | Poly(Glycidyl Methacrylate/n-Butyl Acrylate) Copolymer (B10) | | | | | | | |
| | Poly(Glycidyl Methacrylate) (B11) | | | | | | | |
| | Poly(Glycidyl Methacrylate/n-Butyl Acrylate) Copolymer (B12) | | | | | | | |
| | Isophorone Diisocyanate (B13) | | | | | | | |
| Another Curable Compound | Polyimide Precursor | Rikacoat SN-20 | | | | | | |
| Base Proliferating Agent (C) | Flu4 (C1) | | | | | 75 | | |
| | HDI-Fluorenemethanol Adduct (C2) | | | | | | | |
| Photo-sensitizer (D) | Diethylthioxanthone (D1) | | | | | | 5 | |
| | 9,10-Dibutoxyanthracene (D2) | | | | | | | |
| | Benzophenone (D3) | | | | | | | |
| Evaluation | Basic Functional Group of Basic Compound (a2)/Curable Functional Group of Curable Compound (B) | | 0.94 | 0.79 | 0.22 | 0.46 | 0.91 | 1.72 |
| | Functional Group Equivalent of Curable Compound (B) | | 195 | 190 | 190 | 190 | 190 | 190 |
| | Tack-Free Radiation Energy | mJ/cm² | 550 | 600 | 400 | 300 | 250 | not less than 10000 |
| | Shear Adhesion Strength | Acrylic Plate kgf/cm² | 17 | 15 | 14 | 18 | 19 | not more than 0.01 |
| | | Glass Plate kgf/cm² | 14 | 16 | 17 | 18 | 18 | not more than 0.01 |
| | Peel Adhesion Strength | Acrylic Plate kgf/cm | 0.9 | 0.8 | 0.7 | 0.6 | 0.8 | not more than 0.01 |
| | | Glass Plate kgf/cm | 0.7 | 0.6 | 0.8 | 0.8 | 0.7 | not more than 0.01 |
| | Cross-Cut Tape Test | | 6 | 3 | 4 | 5 | 5 | 0 |

TABLE 2

| | | | Ex. | | | | | | |
|---|---|---|---|---|---|---|---|---|---|
| | | | 12 | 13 | 14 | 15 | 16 | 17 | 18 |
| Blended Ingredient (parts by weight) | Photobase Generator (A) | Photobase Generator (A1) | | | | | | | |
| | | Photobase Generator (A2) | | | | | | 100 | 150 |
| | | Photobase Generator (A3) | | | | | | | |
| | | Photobase Generator (A4) | 10 | | | | | | |
| | | Photobase Generator (A5) | | 10 | | | | | |
| | | Photobase Generator (A6) | | | 10 | | | | |
| | | Photobase Generator (A7) | | | | 100 | | | |
| | | Photobase Generator (A8) | | | | | 80 | | |
| | Another Photobase Generator | Carbamoyloxyimino Compound | | | | | | | |
| | Curable Compound (B) | (Meth)acrylic Resin (B1) Aronix M8030 | | | | | | | |
| | | Compound Having Isocyanato Groups (B2) Urethane Polymer | | | | | | | |
| | | Compound Having Acid Anhydride Groups (B3) Rikacid MTA15 | | | | | | | |
| | | Compound Having Alkoxysilyl Groups (B4) | | | | | | | |
| | | Epoxy Resin (B5) Epicoat 828 | 100 | 100 | 100 | 100 | 100 | | |
| | | Epoxy Resin (B6) Epicoat 152 | | | | | | | |
| | | Epoxy Resin (B7) Epicoat 1031S | | | | | | | |
| | | Poly(Glycidyl Methacrylate/n-Butyl Acrylate) Copolymer (B8) | | | | | | 100 | 100 |
| | | Poly(Glycidyl Methacrylate/n-Butyl Acrylate) Copolymer (B9) | | | | | | | |
| | | Poly(Glycidyl Methacrylate/n-Butyl Acrylate) Copolymer (B10) | | | | | | | |
| | | Poly(Glycidyl Methacrylate) (B11) | | | | | | | |

TABLE 2-continued

|  |  |  |  |  |  |  |  |  |  |
|---|---|---|---|---|---|---|---|---|---|
|  |  | Poly(Glycidyl Methacrylate/n-Butyl Acrylate) Copolymer (B12) |  |  |  |  |  |  |  |
|  |  | Isophorone Diisocyanate (B13) |  |  |  |  |  |  |  |
|  | Another Curable Compound | Polyimide Precursor | Rikacoat SN-20 |  |  |  |  |  |  |
|  | Base Proliferating Agent (C) | Flu4 (C1) |  |  |  |  |  |  |  |
|  |  | HDI-Fluorenemethanol Adduct (C2) |  |  |  |  |  |  |  |
|  | Photo-sensitizer (D) | Diethylthioxanthone (D1) |  |  |  |  |  |  |  |
|  |  | 9,10-Dibutoxyanthracene (D2) |  |  |  |  |  |  |  |
|  |  | Benzophenone (D3) |  |  |  |  |  |  |  |
| Evaluation | Basic Functional Group of Basic Compound (a2)/ Curable Functional Group of Curable Compound (B) |  |  | 0.05 | 0.06 | 0.06 | 0.51 | 0.60 | 0.79 | 1.19 |
|  | Functional Group Equivalent of Curable Compound (B) |  |  | 190 | 190 | 190 | 190 | 190 | 284 | 284 |
|  | Tack-Free Radiation Energy |  | mJ/cm² | 800 | 800 | 700 | 400 | 700 | 200 | 200 |
|  | Shear Adhesion Strength | Acrylic Plate | kgf/cm² | 13 | 14 | 14 | 19 | 16 | 19 | 23 |
|  |  | Glass Plate | kgf/cm² | 14 | 14 | 16 | 22 | 14 | 14 | 21 |
|  | Peel Adhesion Strength | Acrylic Plate | kgf/cm | 0.8 | 0.9 | 0.8 | 1.3 | 0.9 | 1.8 | 1.6 |
|  |  | Glass Plate | kgf/cm | 0.5 | 0.9 | 0.9 | 1.6 | 0.7 | 1.4 | 1.7 |
|  | Cross-Cut Tape Test |  |  | 6 | 7 | 6 | 7 | 6 | 7 | 7 |

|  |  |  |  | Ex. | | | | | | |
|---|---|---|---|---|---|---|---|---|---|---|
|  |  |  |  | 19 | 20 | 21 | 22 | 23 | 24 | 25 |
| Blended Ingredient (parts by weight) | Photobase Generator (A) | Photobase Generator (A1) |  |  |  |  |  |  |  |  |
|  |  | Photobase Generator (A2) |  | 0.5 | 15 | 9 | 1.5 | 100 | 1 | 100 |
|  |  | Photobase Generator (A3) |  |  |  |  |  |  |  |  |
|  |  | Photobase Generator (A4) |  |  |  |  |  |  |  |  |
|  |  | Photobase Generator (A5) |  |  |  |  |  |  |  |  |
|  |  | Photobase Generator (A6) |  |  |  |  |  |  |  |  |
|  |  | Photobase Generator (A7) |  |  |  |  |  |  |  |  |
|  |  | Photobase Generator (A8) |  |  |  |  |  |  |  |  |
|  | Another Photobase Generator | Carbamoyloxyimino Compound |  |  |  |  |  |  |  |  |
|  | Curable Compound (B) | (Meth)acrylic Resin (B1) | Aronix M8030 |  |  |  |  |  |  |  |
|  |  | Compound Having Isocyanato Groups (B2) | Urethane Polymer |  |  |  |  |  |  |  |
|  |  | Compound Having Acid Anhydride Groups (B3) | Rikacid MTA15 |  |  |  |  |  |  |  |
|  |  | Compound Having Alkoxysilyl Groups (B4) |  |  |  |  |  |  |  |  |
|  |  | Epoxy Resin (B5) | Epicoat 828 |  |  |  |  |  |  |  |
|  |  | Epoxy Resin (B6) | Epicoat 152 |  |  |  |  |  |  |  |
|  |  | Epoxy Resin (B7) | Epicoat 1031S |  |  |  |  |  |  |  |
|  |  | Poly(Glycidyl Methacrylate/n-Butyl Acrylate) Copolymer (B8) |  | 100 |  |  |  |  |  |  |
|  |  | Poly(Glycidyl Methacrylate/n-Butyl Acrylate) Copolymer (B9) |  |  | 100 | 100 |  |  |  |  |
|  |  | Poly(Glycidyl Methacrylate/n-Butyl Acrylate) Copolymer (B10) |  |  |  |  | 100 |  |  |  |
|  |  | Poly(Glycidyl Methacrylate) (B11) |  |  |  |  |  | 100 |  |  |
|  |  | Poly(Glycidyl Methacrylate/n-Butyl Acrylate) Copolymer (B12) |  |  |  |  |  |  | 100 |  |
|  |  | Isophorone Diisocyanate (B13) |  |  |  |  |  |  |  | 100 |
|  | Another Curable Compound | Polyimide Precursor | Rikacoat SN-20 |  |  |  |  |  |  |  |
|  | Base Proliferating Agent (C) | Flu4 (C1) |  |  |  |  |  |  |  |  |
|  |  | HDI-Fluorenemethanol Adduct (C2) |  |  |  |  |  |  |  |  |
|  | Photo-sensitizer (D) | Diethylthioxanthone (D1) |  |  |  |  |  |  |  |  |
|  |  | 9,10-Dibutoxyanthracene (D2) |  |  |  |  |  |  |  |  |
|  |  | Benzophenone (D3) |  |  |  |  |  |  |  |  |
| Evaluation | Basic Functional Group of Basic Compound (a2)/ Curable Functional Group of Curable Compound (B) |  |  | 0.004 | 3.34 | 2.00 | 1.88 | 0.40 | 1.84 | 0.31 |
|  | Functional Group Equivalent of Curable Compound (B) |  |  | 284 | 8000 | 8000 | 45000 | 142 | 66000 | 111 |
|  | Tack-Free Radiation Energy |  | mJ/cm² | 10000 | 200 | 300 | 500 | 200 | 400 | 500 |
|  | Shear Adhesion Strength | Acrylic Plate | kgf/cm² | 0.6 | 2.4 | 14 | 17 | 4.1 | 2.6 | 7 |
|  |  | Glass Plate | kgf/cm² | 0.8 | 3.1 | 15 | 17 | 3.9 | 2.4 | 4 |
|  | Peel Adhesion Strength | Acrylic Plate | kgf/cm | 0.4 | 0.7 | 1.2 | 2.1 | 0.6 | 1.3 | 0.3 |
|  |  | Glass Plate | kgf/cm | 0.3 | 0.5 | 1.6 | 2.3 | 0.8 | 1.1 | 0.4 |
|  | Cross-Cut Tape Test |  |  | 4 | 5 | 7 | 7 | 3 | 4 | 2 |

TABLE 3

|  |  |  |  | Ex. | | | | | | |
|---|---|---|---|---|---|---|---|---|---|---|
|  |  |  |  | 26 | 27 | 28 | 29 | 30 | 31 | 32 |
| Blended Ingredient (parts by weight) | Photobase Generator (A) | Photobase Generator (A1) | | | | | | | | |
| | | Photobase Generator (A2) | | 75 | 75 | 75 | 75 | 75 | 75 | 75 |
| | | Photobase Generator (A3) | | | | | | | | |
| | | Photobase Generator (A4) | | | | | | | | |
| | | Photobase Generator (A5) | | | | | | | | |
| | | Photobase Generator (A6) | | | | | | | | |
| | | Photobase Generator (A7) | | | | | | | | |
| | | Photobase Generator (A8) | | | | | | | | |
| | Another Photobase Generator | Carbamoyloxyimino Compound | | | | | | | | |
| | Curable Compound (B) | (Meth)acrylic Resin (B1) | Aronix M8030 | | | | | | | |
| | | Compound Having Isocyanato Groups (B2) | Urethane Polymer | | | | | | | |
| | | Compound Having Acid Anhydride Groups (B3) | Rikacid MTA15 | | | | | | | |
| | | Compound Having Alkoxysilyl Groups (B4) | | | | | | | | |
| | | Epoxy Resin (B5) | Epicoat 828 | 100 | 100 | 100 | 100 | 100 | 100 | 100 |
| | | Epoxy Resin (B6) | Epicoat 152 | | | | | | | |
| | | Epoxy Resin (B7) | Epicoat 1031S | | | | | | | |
| | | Poly(Glycidyl Methacrylate/n-Butyl Acrylate) Copolymer (B8) | | | | | | | | |
| | | Poly(Glycidyl Methacrylate/n-Butyl Acrylate) Copolymer (B9) | | | | | | | | |
| | | Poly(Glycidyl Methacrylate/n-Butyl Acrylate) Copolymer (B10) | | | | | | | | |
| | | Poly(Glycidyl Methacrylate) (B11) | | | | | | | | |
| | | Poly(Glycidyl Methacrylate/n-Butyl Acrylate) Copolymer (B12) | | | | | | | | |
| | | Isophorone Diisocyanate (B13) | | | | | | | | |
| | Another Curable Compound | Polyimide Precursor | Rikacoat SN-20 | | | | | | | |
| | Base Proliferating Agent (C) | Flu4 (C1) | | 10 | 30 | 90 | 120 | | | |
| | | HDI-Fluorenemethanol Adduct (C2) | | | | | | 75 | | |
| | Photo-sensitizer (D) | Diethylthioxanthone (D1) | | | | | | | 0.5 | 1 |
| | | 9,10-Dibutoxyanthracene (D2) | | | | | | | | |
| | | Benzophenone (D3) | | | | | | | | |
| Evaluation | Basic Functional Group of Basic Compound (a2)/ Curable Functional Group of Curable Compound (B) | | | 0.20 | 0.20 | 0.20 | 0.20 | 0.20 | 0.20 | 0.20 |
| | Functional Group Equivalent of Curable Compound (B) | | | 190 | 190 | 190 | 190 | 190 | 190 | 190 |
| | Tack-Free Radiation Energy | | mJ/cm² | 700 | 600 | 200 | 200 | 300 | 500 | 400 |
| | Shear Adhesion Strength | Acrylic Plate | kgf/cm² | 13 | 18 | 20 | 14 | 16 | 14 | 16 |
| | | Glass Plate | kgf/cm² | 12 | 21 | 19 | 10 | 14 | 13 | 14 |
| | Peel Adhesion Strength | Acrylic Plate | kgf/cm | 0.8 | 1.6 | 1.9 | 1.1 | 1.5 | 0.9 | 1.3 |
| | | Glass Plate | kgf/cm | 1 | 1.9 | 2.1 | 1.2 | 1.6 | 0.9 | 1.4 |
| | Cross-Cut Tape Test | | | 7 | 7 | 7 | 6 | 6 | 6 | 7 |

|  |  |  |  | Ex. | | | | | Comp. Ex. |
|---|---|---|---|---|---|---|---|---|---|
|  |  |  |  | 33 | 34 | 35 | 36 | 37 | 2 |
| Blended Ingredient (parts by weight) | Photobase Generator (A) | Photobase Generator (A1) | | | | | | | |
| | | Photobase Generator (A2) | | 75 | 75 | 75 | 75 | 75 | |
| | | Photobase Generator (A3) | | | | | | | |
| | | Photobase Generator (A4) | | | | | | | |
| | | Photobase Generator (A5) | | | | | | | |
| | | Photobase Generator (A6) | | | | | | | 20 |
| | | Photobase Generator (A7) | | | | | | | |
| | | Photobase Generator (A8) | | | | | | | |
| | Another Photobase Generator | Carbamoyloxyimino Compound | | | | | | | |
| | Curable Compound (B) | (Meth)acrylic Resin (B1) | Aronix M8030 | | | | | | |
| | | Compound Having Isocyanato Groups (B2) | Urethane Polymer | | | | | | |
| | | Compound Having Acid Anhydride Groups (B3) | Rikacid MTA15 | | | | | | |
| | | Compound Having Alkoxysilyl Groups (B4) | | | | | | | |
| | | Epoxy Resin (B5) | Epicoat 828 | 100 | 100 | 100 | 100 | 100 | |
| | | Epoxy Resin (B6) | Epicoat 152 | | | | | | |
| | | Epoxy Resin (B7) | Epicoat 1031S | | | | | | |
| | | Poly(Glycidyl Methacrylate/n-Butyl Acrylate) Copolymer (B8) | | | | | | | |
| | | Poly(Glycidyl Methacrylate/n-Butyl Acrylate) Copolymer (B9) | | | | | | | |
| | | Poly(Glycidyl Methacrylate/n-Butyl Acrylate) Copolymer (B10) | | | | | | | |

TABLE 3-continued

|  |  |  |  |  |  |  |  |  |
|---|---|---|---|---|---|---|---|---|
|  |  | Poly(Glycidyl Methacrylate) (B11) |  |  |  |  |  |  |
|  |  | Poly(Glycidyl Methacrylate/n-Butyl Acrylate) Copolymer (B12) |  |  |  |  |  |  |
|  |  | Isophorone Diisocyanate (B13) |  |  |  |  |  |  |
|  | Another Curable Compound | Polyimide Precursor | Rikacoat SN-20 |  |  |  |  | 100 |
|  | Base Proliferating Agent (C) | Flu4 (C1) |  |  |  |  |  |  |
|  |  | HDI-Fluorenemethanol Adduct (C2) |  |  |  |  |  |  |
|  | Photo-sensitizer (D) | Diethylthioxanthone (D1) |  | 10 | 30 | 60 |  |  |
|  |  | 9,10-Dibutoxyanthracene (D2) |  |  |  |  | 5 |  |
|  |  | Benzophenone (D3) |  |  |  |  |  | 5 |
| Evaluation | Basic Functional Group of Basic Compound (a2)/ Curable Functional Group of Curable Compound (B) |  |  | 0.20 | 0.20 | 0.20 | 0.20 | 0.20 | — |
|  | Functional Group Equivalent of Curable Compound (B) |  |  | 190 | 190 | 190 | 190 | 190 | — |
|  | Tack-Free Radiation Energy |  | mJ/cm$^2$ | 100 | <100 | <100 | 300 | 300 | ※1 |
|  | Shear Adhesion Strength | Acrylic Plate | kgf/cm$^2$ | 19 | 13 | 2 | 19 | 20 | Lamination Impossible |
|  |  | Glass Plate | kgf/cm$^2$ | 19 | 10 | 3 | 22 | 21 | Lamination Impossible |
|  | Peel Adhesion Strength | Acrylic Plate | kgf/cm | 1.6 | 0.5 | 0.1 | 1.8 | 1.9 | Lamination Impossible |
|  |  | Glass Plate | kgf/cm | 1.8 | 0.3 | 0.1 | 1.6 | 1.6 | Lamination Impossible |
|  | Cross-Cut Tape Test |  |  | 7 | 5 | 5 | 6 | 6 | 7 |

※1 Tack-free state has been achieved before radiation of UV rays.

The invention claimed is:

1. A photocurable composition comprising:
a photobase generator (A) which is a salt of a carboxylic acid (a1-1) represented by the following formula (1-1) with a basic compound (a2), and at least one curable compound (B),
each curable compound (B) is a curable compound having at least two (meth)acryloyl groups in one molecule,

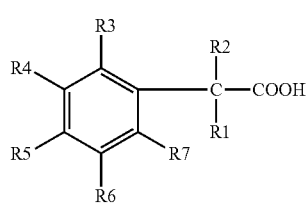

(1-1)

where R1 to R7 in the above formula (1-1) each are hydrogen or an organic group, R1 to R7 may be the same or different, and two of R1 to R7 may be bonded to each other to form a ring structure,
wherein an average of values calculated by dividing, a number-average molecular weight of each curable compound (B) by the corresponding number of (meth)acryloyl groups is within the range of 170 to 50000.

2. The photocurable composition according to claim 1, wherein one of R3 to R7 in the above formula (1-1) is an organic group represented by the following formula (1-2),

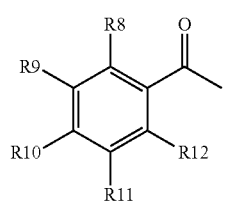

(1-2)

where R8 to R2 in the above formula (1-2) each are hydrogen or an organic group, R8 to R12 may be the same or different, and two of R8 to R12 may be bonded to each other to form a ring structure.

3. The photocurable composition according to claim 1, wherein R1 in the above formula (1-1) is a methyl group.

4. The photocurable composition according to claim 1, wherein the carboxylic acid (a1-1) represented by the above formula (1-1) is a carboxylic acid (a1) represented by the following formula (1).

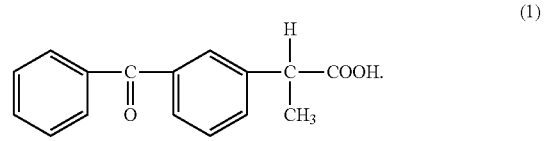 [SMILES: CC(C(=O)O)c1cccc(C(=O)c2ccccc2)c1]

(1)

5. The photocurable composition according to claim 1, wherein the basic compound (a2) is an amine.

6. The photocurable composition according to claim 5, wherein the amine has at least two amino groups in one molecule.

7. The photocurable composition according to claim 5, wherein the amine is an amine represented by any one of the following formulae (2) to (7):

(2)

(3)

(4)

-continued

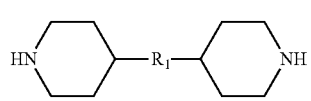
(5)

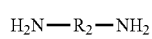
(6)

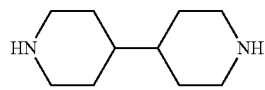
(7)

where $R_1$ in the above formula (5) is a $C_1$-$C_{10}$ alkylene group, and $R_2$ in the above formula (6) is a $C_1$-$C_{10}$ alkylene group.

8. The photocurable composition according to claim 1, which further comprises a base proliferating agent (C).

9. The photocurable composition according to claim 1, which further comprises a photosensitizer (D).

10. The photocurable composition according to claim 1, wherein a molar ratio of (meth)acryloyl groups of the curable compound (B) to a basic functional group of the basic compound (a2) is within the range of 1:0.01 to 1:2.

11. The photocurable composition according to claim 8, which further comprises a photo-sensitizer (D).

12. The photocurable composition according to claim 1, the photocurable composition is an adhesive or a coating agent.

* * * * *